United States Patent [19]

Sugawara et al.

[11] Patent Number: 5,790,335
[45] Date of Patent: Aug. 4, 1998

[54] ASYMMETRICAL SIGNAL DETECTOR AND SIGNAL REGENERATING APPARATUS USING THE SAME DETECTOR

[75] Inventors: Takao Sugawara; Takenori Ohshima, both of Kawasaki, Japan

[73] Assignee: Fujitsu Limited, Kawasaki, Japan

[21] Appl. No.: 588,999

[22] Filed: Jan. 19, 1996

[30] Foreign Application Priority Data

Mar. 13, 1995 [JP] Japan ................................. 7-052350

[51] Int. Cl.$^6$ ...................................................... G11B 5/02
[52] U.S. Cl. .................................................. 360/68; 360/65
[58] Field of Search ............................... 360/68, 65, 113, 360/70, 51, 46; 375/341, 232, 231; 348/668, 667, 664, 665, 624, 671, 614

[56] References Cited

U.S. PATENT DOCUMENTS

| 4,591,939 | 5/1986 | Sakuma et al. | 360/46 |
| 5,469,305 | 11/1995 | Madsen et al. | 360/51 |
| 5,583,706 | 12/1996 | Dudley et al. | 360/51 X |

FOREIGN PATENT DOCUMENTS

| 091304A1 | 10/1983 | German Dem. Rep. |
| 5731045 | 2/1982 | Japan. |
| 61-289727 | 12/1986 | Japan. |
| 48007 | 1/1992 | Japan. |
| 4205903 | 7/1992 | Japan. |
| 555852 | 3/1993 | Japan. |
| 5159209 | 6/1993 | Japan. |
| 5325110 | 12/1993 | Japan. |
| 613900 | 1/1994 | Japan. |

*Primary Examiner*—W. R. Young
*Assistant Examiner*—Patrick Wamsley

[57] ABSTRACT

Disclosed are an asymmetrical signal detector for detecting an asymmetrical quantity of an asymmetrical signal and a signal regenerating apparatus using this detector. This detector includes a first delaying element for delaying the input signal, a first subtracting element for subtracting an output of the first delaying element from the input signal, a second delaying element for delaying an output of the first subtracting element, an adding element for adding an output of the second delaying element to an output of the first subtracting element, a gate signal generating element for generating a gate signal by comparing an output of the adding element with a predetermined threshold value, a second subtracting element for subtracting the output of the subtracting element from the input signal and a selecting element for selecting an output of the second subtracting element in accordance with the gate signal, thereby obtaining an offset quantity. And this detector further includes a third subtracting element for subtracting an output of the second delaying element from an output of the first subtracting element and a selecting element for selecting an output of the third subtracting element in accordance with the gate signal, thereby obtaining between-positive-negative amplitude error quantity.

7 Claims, 21 Drawing Sheets

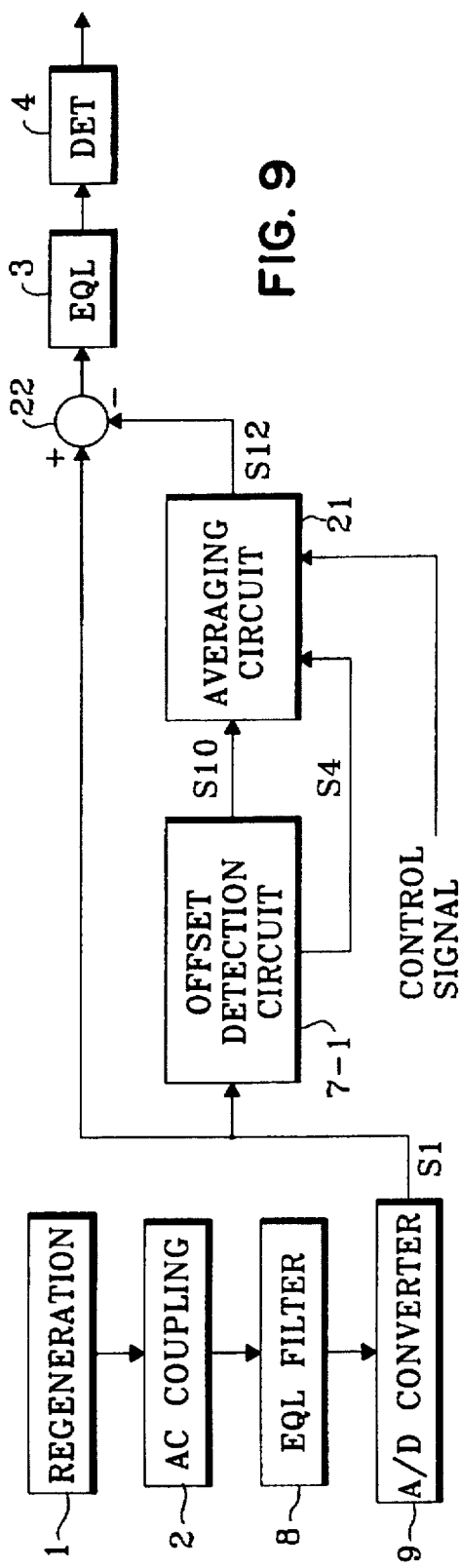
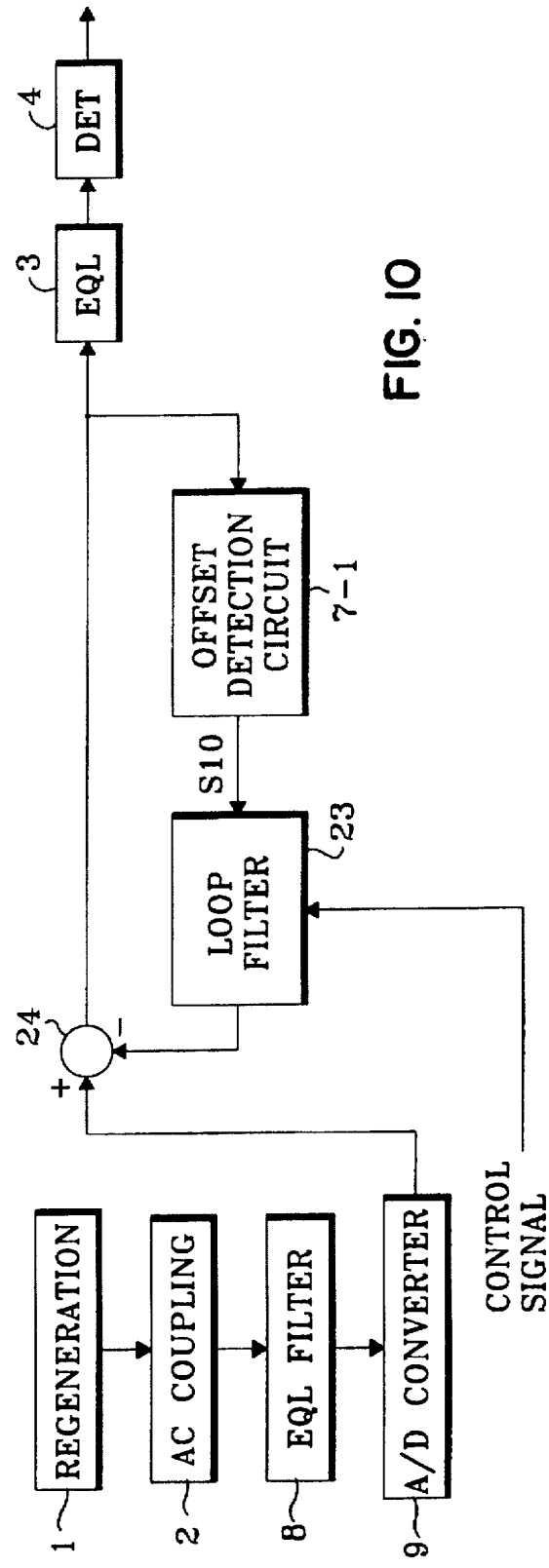

ial signal detector and signal regenerating apparatus using the same detector

BACKGROUND OF THE INVENTION

1. Field of the Invention

The present invention relates to an asymmetrical signal detector, used for magnetic recording and communications, for detecting an asymmetrical quantity of an asymmetrical signal and to a signal regenerating apparatus using this detector.

2. Description of the Related Art

In the fields of magnetic recording and communications, there is a case where an input signal is asymmetrical with respect to positive and negative sides. For example, in the field of a magnetic recording apparatus, a read signal waveform tends to be asymmetrical with respect to the positive/negative sides because of adopting an MR (Magneto-Resistive) head. It is therefore necessary to detect an amplitude value of each of the positive/negative components as well as an amplitude error value between signal positive/negative components and an offset quantity and also compensate an asymmetrical signal.

FIGS. 24A and 24B are diagrams of assistance in explaining an operation of the MR head. FIG. 25 is a block diagram showing the prior art. FIG. 26 is an explanatory diagram showing an offset.

FIG. 24A illustrates an operation curve of the MR (Magneto-Resistive) head used for a magnetic disc device, etc.. Record data are read by making use of the fact that a resistive rate ρ of an MR element changes with respect to an input magnetic field H from a magnetic record medium. Generally, the head is biased to a bias magnetic field Hb. Accordingly, an output signal OUT becomes bipolar (+1, 0, −1).

Further, ideally, a linear area (straight line area) of this operation curve is used. Therefore, if an input signal IN (magnetic field recorded) is symmetrical with respect to the positive and negative sides, the output signal OUT also has a symmetrical signal amplitude with respect to the positive and negative sides.

FIG. 24B shows a case where a non-linear area on the operation curve is used because of the bias point Hb deviating. At this time, the output signal OUT becomes a signal that is asymmetrical with respect to the positive and negative sides.

FIG. 25 illustrates a construction of a signal processing system in a conventional magnetic recording/reproducing apparatus. As shown in FIG. 25, a magnetic recording/reproducing system 1 is constructed of a magnetic record medium and a magnetic head. A signal read by the magnetic head is inputted to an equalizer 3 via an AC coupling unit 2 composed of an amplifier and a filter. The equalizer 3 shapes a waveform of the signal inputted. Thereafter, a data detector 4 detects pieces of data [0], [1] from waveform-equalized signals. Thus, the magnetic recording/reproducing system 1 is linked via the Ac coupling unit to the equalizer 3.

Referring to FIG. 26, the symbols IN1, IN2 designates signal waveforms before AC coupling. The symbol IN1 indicates the waveform that is symmetrical with respect to the positive and negative sides, while IN2 indicates an asymmetrical waveform with respect to the positive and negative sides. Further, the symbols OUT1, OUT2 represent signal waveforms after the AC coupling. The symbol OUT1 indicates a symmetrical waveform with respect to the positive and negative sides, while OUT2 indicates an asymmetrical waveform with respect to the positive and negative sides.

As illustrated in FIG. 26, if the signal is symmetrical with respect to the positive and negative sides, a 0-level of the signal never fluctuates. Whereas if the signal is asymmetrical with respect to the positive and negative sides, the 0-level fluctuates by V0. That is, an offset is produced.

In general, a linear type equalizer is employed. For this reason, when the input signal has a between-positive-negative asymmetrical signal amplitude, and when the offset is caused, there arises a problem in which the equalizer encounters difficulties in equalizing the signal to a desired waveform.

Further, a problem is that a deviation (equalizing error) from the desired waveform increases the likelihood of a subsequent misjudgment of [0], [1] on the part of the detector.

Besides, there exists a problem, wherein even detecting the amplitude value of such an asymmetrical signal becomes difficult due to the secondarily-produced offset.

SUMMARY OF THE INVENTION

It is a primary object of the present invention to provide an asymmetrical signal detector for detecting an offset quantity of an asymmetrical signal, and a signal regenerating apparatus using this detector.

It is another object of the present invention to provide a asymmetrical signal detector for detecting a between-positive-and-negative amplitude error quantity of the asymmetrical signal and a signal regenerating apparatus using this detector.

It is still another object of the present invention to provide an asymmetrical signal detector for detecting each of positive/negative amplitude quantities of the asymmetrical signal and a signal regenerating apparatus using this detector.

It is a further object of the present invention to provide a signal regenerating apparatus for regenerating a signal by compensating the asymmetrical signal.

For accomplishing the above objects, according to a first mode of an asymmetrical signal detector of the present invention, an asymmetrical signal detector for detecting a signal quantity generated due to asymmetry of an input signal comprises a first delaying element for delaying the input signal, a first subtracting element for subtracting an output of the first delaying element from the input signal, a second delaying element for delaying an output of the first subtracting element and an adding element for adding an output of the second delaying element to an output of the first subtracting element. The asymmetrical signal detector further comprises a gate signal generating element for generating a gate signal by comparing an output of the adding element with a predetermined threshold value, a second subtracting element for subtracting the output of the subtracting element from the input signal and a selecting element for selecting an output of the second subtracting element in accordance with the gate signal.

According to the first mode of the asymmetrical signal detector of the present invention, when the output of the first delaying element is subtracted from the input signal, a signal from which the offset is removed is obtained. A signal obtained by delaying this signal with the second delaying element is added to the signal with the offset eliminated, thereby generating the gate signal. Further, when subtracting the signal from which the offset is removed from the input signal, a signal containing the offset component is obtained. This signal is gated by a gate signal, whereby an offset quantity can be detected.

Thus, the signal from which the offset is removed is generated, and the offset quantity is detected based on this signal. Hence, the offset quantity can be accurately detected from the input signal.

According to a second mode of the asymmetrical signal detector of the present invention, an asymmetrical signal detector for detecting a signal quantity generated due to asymmetry of an input signal comprises a first delaying element for delaying the input signal, a first subtracting element for subtracting an output of the first delaying element from the input signal and a second delaying element for delaying an output of the first subtracting element. The asymmetrical signal detector further comprises an adding element for adding an output of the second delaying element to an output of the first subtracting element, a gate signal generating element for generating a gate signal by comparing an output of the adding element with a predetermined threshold value, a third subtracting element for subtracting an output of the second delaying element from an output of the first subtracting element and a selecting element for selecting an output of the third subtracting element in accordance with the gate signal.

According to the second mode of the asymmetrical signal detector of the present invention, the output of the first delaying element is subtracted from the input signal, thereby obtaining the signal from which the offset is removed. The signal obtained by delaying this signal with the second delaying element is added to the signal from which the offset is removed, thereby generating the gate signal. Further, when the signal delayed by the second delaying element is subtracted from the signal from which the offset is removed, a signal containing a between-positive-negative amplitude error quantity is obtained. This signal is gated by the gate signal, thereby obtaining the between-positive-negative amplitude error quantity.

Thus, the signal from which the offset is removed is generated, and the between-positive-negative amplitude error quantity is detected based on this signal. Hence, it is possible to accurately detect the between-positive-negative amplitude error quantity from the input signal.

According to a third mode of the asymmetrical signal detector, an asymmetrical signal detector for detecting a signal quantity generated due to asymmetry of an input signal comprises a first delaying element for delaying the input signal, a first subtracting element for subtracting an output of the first delaying element from the input signal, a second delaying element for delaying an output of the first subtracting element, an adding element for adding an output of the second delaying element to an output of the first subtracting element, a gate signal generating element for generating a gate signal by comparing an output of the adding element with a predetermined threshold value and a selecting element for selecting an output of the first subtracting element in accordance with the gate signal.

According to the third mode of the asymmetrical detector of the present invention, the output of the first delaying element is subtracted from the input signal, thereby obtaining the signal from which the offset is removed. The signal obtained by delaying this signal with the second delaying element is added to the signal from which the offset is removed, thereby generating the gate signal. Further, the signal from which the offset is removed is gated by the gate signal, whereby each of the positive/negative amplitude values is obtained.

Thus, the signal from which the offset is removed is generated, and each of the positive/negative amplitude values is detected based on this signal. It is therefore possible to accurately detect each of the positive/negative amplitude values from the input signal.

According to a first mode of a signal regenerating apparatus of the present invention, a signal regenerating apparatus for regenerating a read signal read by an MR head comprises an asymmetrical signal detection circuit for detecting an amplitude error signal between a positive signal component and a negative signal component of the read signal from a training signal of the read signal, a current control circuit for controlling a sense current of the MR head in accordance with the detected amplitude error signal, an equalizing circuit for equalizing the read signal and a data detection circuit for detecting data from an output of the equalizing circuit.

According to the first mode of the signal regenerating apparatus of the present invention, a sense current of the MR head is controlled based on the between-positive-and-negative amplitude error quantity, and hence the read output of the MR head can be set in a waveform exhibiting symmetry with respect to the positive and negative sides. Further, the amplitude error quantity defined as control quantity is detected from the input signal, whereby the amplitude error quantity can be detected before performing the waveform operation of the equalizing circuit. Therefore, the amplitude error quantity can be accurately detected. Moreover, the amplitude error quantity is obtained from the training signal. A requirement for accurately detecting the amplitude error quantity is that there is no interference between the positive and negative signals. A signal pattern of the training signal can be freely set unlike the data signal, and hence it is therefore possible to set a signal for detecting the amplitude error with no interference in the training signal. The amplitude error quantity can be therefore accurately detected.

According to a second mode of the signal regenerating apparatus of the present invention, a signal regenerating apparatus for regenerating an input signal having a training signal and a data signal comprises an asymmetrical signal detection circuit for detecting an offset quantity of the input signal from the training signal, a subtracting circuit for subtracting the detected offset quantity from the data signal, an equalizing circuit for equalizing an output signal of the subtracting circuit and a data detection circuit for detecting data from an output of the equalizing circuit.

According to the second mode of the signal regenerating apparatus of the present invention, a signal offset quantity is detected and subtracted from the data signal. Therefore, an equalizing operation can be performed from the signal with no offset quantity, and the signal equalization becomes precise. Further, the offset quantity is obtained from the training signal. A requirement for accurately detecting the offset quantity is that there is no interference between the positive and negative signals. The signal pattern of the training signal can be freely set unlike the data signal, and hence there can be set the signal for detecting the offset quantity with no interference in the training signal. The offset quantity can be therefore accurately detected.

According to a third mode of the signal regenerating apparatus of the present invention, a signal regenerating apparatus for regenerating an input signal having a training signal and a data signal comprises an analog/digital converter for converting the input signal into a digital value, an asymmetrical signal detection circuit for detecting an amplitude error signal and a signal offset quantity from the training signal, a subtracting circuit for subtracting the detected offset quantity from the data signal, a circuit for controlling a mid-point reference level of the analog/digital converter on the basis of the amplitude error signal, an equalizing circuit for equalizing an output signal of the analog/digital converter and a data detection circuit for detecting data from an output of the equalizing circuit.

According to the third mode of the signal regenerating apparatus of the present invention, the offset quantity and the amplitude error quantity of the signal are detected, thereby changing a characteristic of the analog/digital converter. Therefore, the equalizing operation can be executed based on the amplitude error quantity and the signal with no offset quantity, and signaling becomes more accurate. Further, the amplitude error quantity and the offset quanti are obtained from the training signals. The requirement for precisely detecting the amplitude error quantity and the offset quantity is that there is no interference between the positive and negative signals. The signal pattern of the training signal can be freely set unlike the data signal, and hence there can be set the signal for detecting the offset quantity and the amplitude error quantity with no interference in the training signal. The offset quantity can be therefore accurately detected.

According to a fourth mode of the signal regenerating apparatus of the present invention, a signal regenerating apparatus for regenerating an input signal having a training signal and a data signal comprises an equalizing circuit for equalizing the input signal, an asymmetrical signal detection circuit for detecting respective signal positive/negative amplitude values from the training signals, a circuit for holding respective positive/negative quotients by dividing an ideal amplitude value by the detected amplitude value and a determining circuit for determining positive/negative polarities of the input signal. The signal regenerating apparatus further comprises a selection circuit for selecting the held positive/negative quotients in accordance with a result of the determination, a multiplying circuit for multiplying the selected quotient by an output of the equalizing circuit and a data detection circuit for detecting data from an output of the multiplying circuit.

According to the fourth mode of the signal regenerating apparatus of the present invention, the respective positive/negative amplitude values are detected. Then, the ideal amplitude value is divided by the positive/negative amplitude values, thereby obtaining the control quantity. The equalizing output is compensated based on this control quantity, whereby the positive/negative amplitude values of the data signal can be set to the ideal amplitude value, and the data can be also detected without any error. Further, the positive and negative amplitude values are detected from the training signals with no signal interference, and hence the positive and negative amplitude values are exactly detectable.

According to a fifth mode of the signal regenerating apparatus of the present invention, a signal regenerating apparatus for regenerating an input signal having a training signal and a data signal comprises an equalizing circuit for equalizing the input signal, an asymmetrical signal detection circuit for detecting respective amplitude values of positive and negative signals of the training signals from the training signals and a circuit for subtracting the detected amplitude value from an ideal amplitude value and holding each of positive/negative difference signals. The signal regenerating apparatus further comprises a determining circuit for determining positive/negative polarities of the input signal, a selecting circuit for selecting the held positive or negative difference signal in accordance with a result of the determination, a multiplying circuit for multiplying the selected difference signal by an output of the equalizing circuit and a data detection circuit for detecting data from an output of the multiplying circuit.

According to the fifth mode of the signal regenerating apparatus of the present invention, the respective positive/negative amplitude values are detected. Then, each of the positive/negative amplitude values is subtracted from the ideal amplitude value, thereby obtaining the control quantity. The equalizing output is compensated based on this control quantity, whereby the positive/negative amplitude values of the data signal can be set to the ideal amplitude value, and the data can be also detected without any error. Further, the positive and negative amplitude values are detected from the training signals with no signal interference, and hence the positive and negative amplitude values are exactly detectable.

According to a sixth mode of the signal regenerating apparatus of the present invention, a signal regenerating apparatus for regenerating an input signal having a training signal and a data signal comprises an equalizing circuit for equalizing the input signal, an asymmetrical signal detection circuit for detecting respective signal positive/negative amplitude values of the training signals from the training signals and a Viterbi detection circuit for maximum-likelihood-decoding an output of the equalizing circuit by use of each of the positive/negative amplitude values as a hypothetical value.

According to the sixth mode of the signal regenerating apparatus of the present invention, the positive and negative amplitude values are used as hypothetical values of the Viterbi detector, and, therefore, in the Viterbi detecting step, the asymmetrical characteristic can be compensated. Further, since the positive and negative amplitude values are detected from the training signals with no signal interference, the positive and negative amplitude values can be precisely detected.

Other features and advantages of the present invention will become readily apparent from the following description taken in conjunction with the accompanying drawings.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principle of the invention, in which:

FIG. 9 is a diagram showing a construction of a second embodiment of the signal regenerating apparatus of the present invention;

FIG. 10 is a diagram showing a construction of a third embodiment of the signal regenerating apparatus of the present invention;

DETAILED DESCRIPTION OF THE PREFERRED EMBODIMENTS

Figure 1:
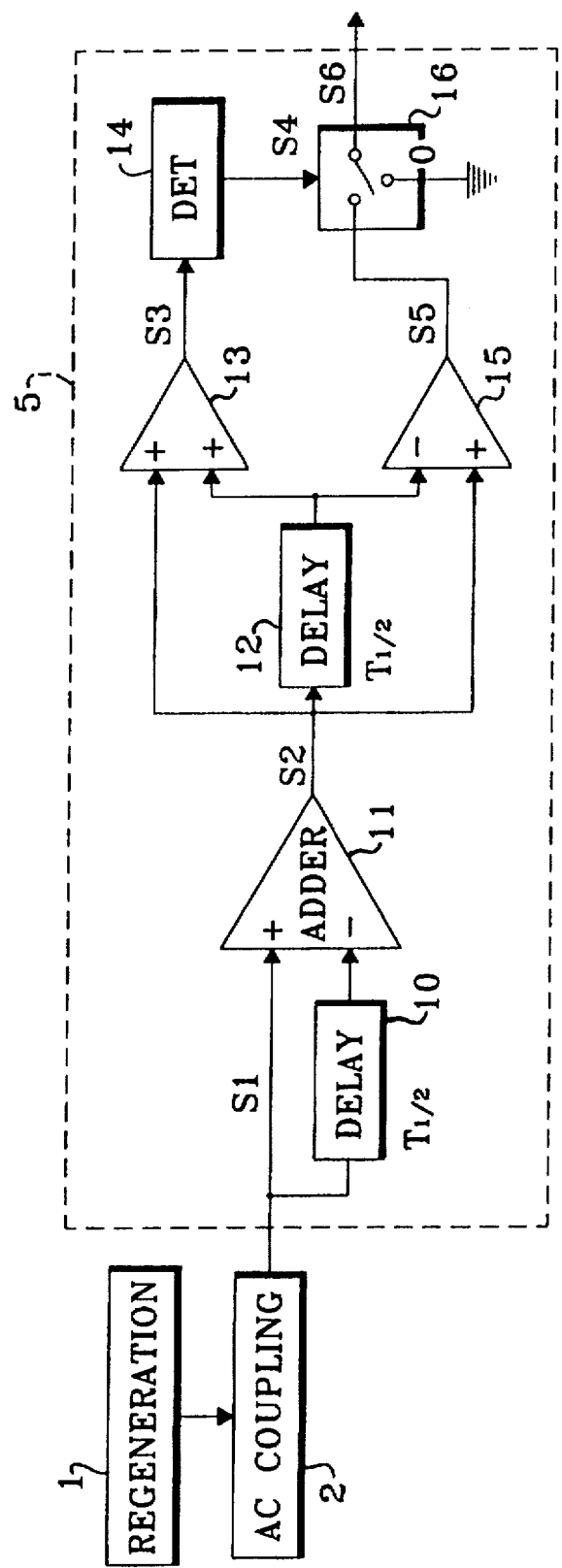
FIG. 1 is a block diagram illustrating one embodiment of an asymmetrical signal detector according to the present invention.
Figure 2:
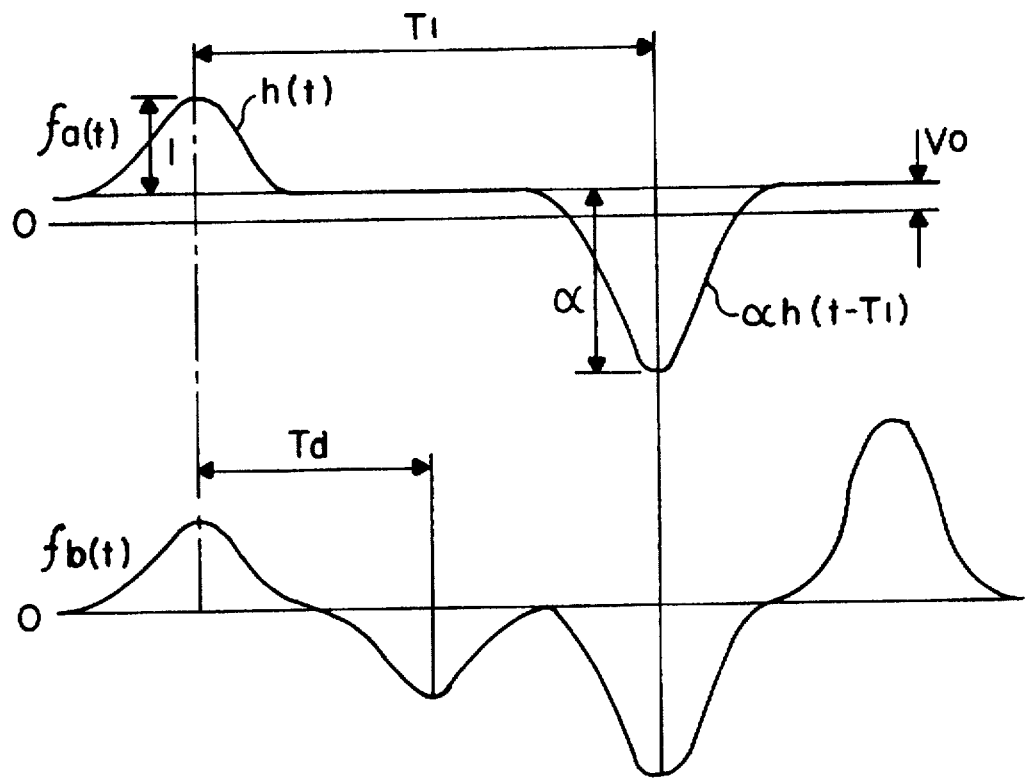
FIG. 2 is a diagram of assistance in explaining how an offset is removed in FIG. 1.
Figure 3:
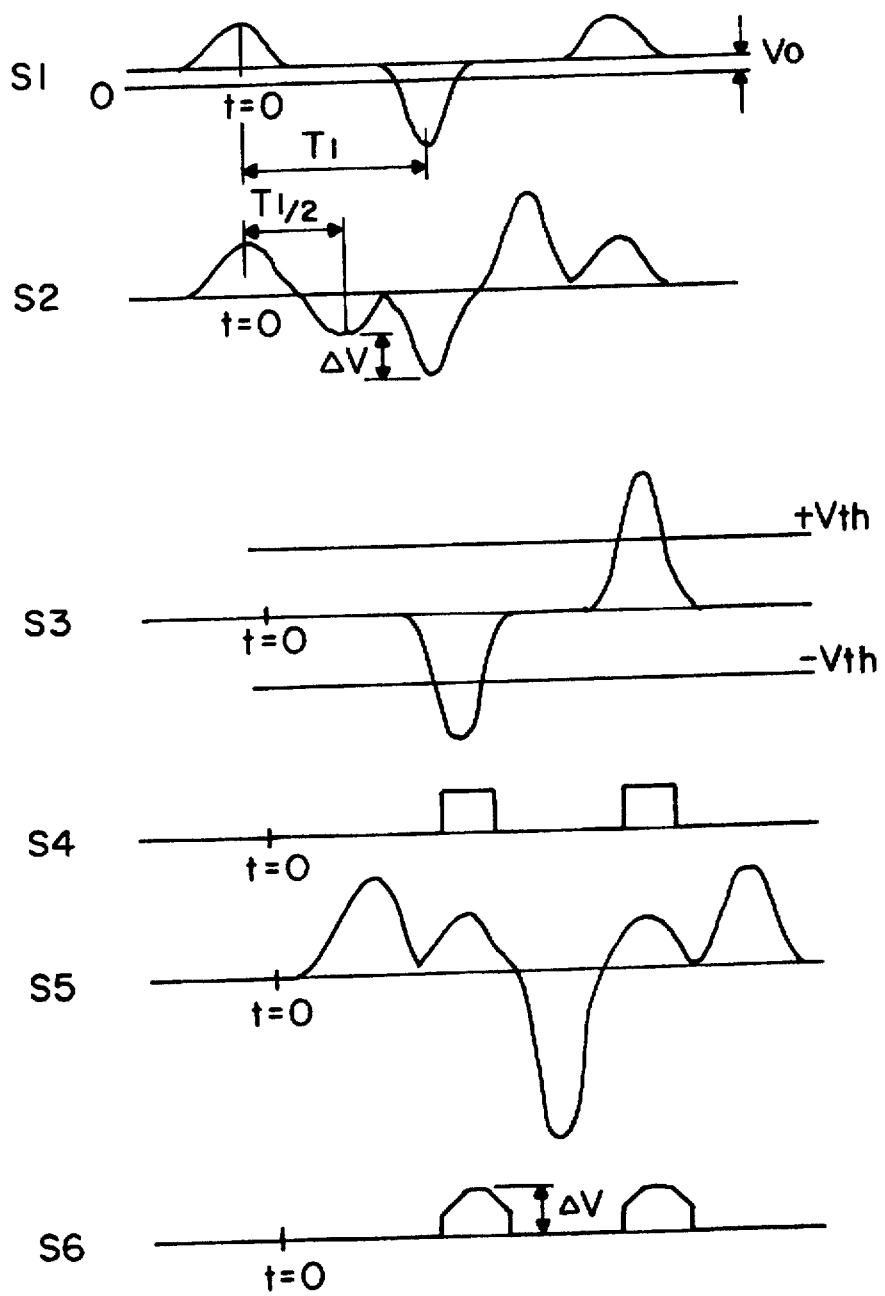
FIG. 3 is a diagram showing a waveform when $\alpha > 1$ in FIG. 1.
Figure 4:
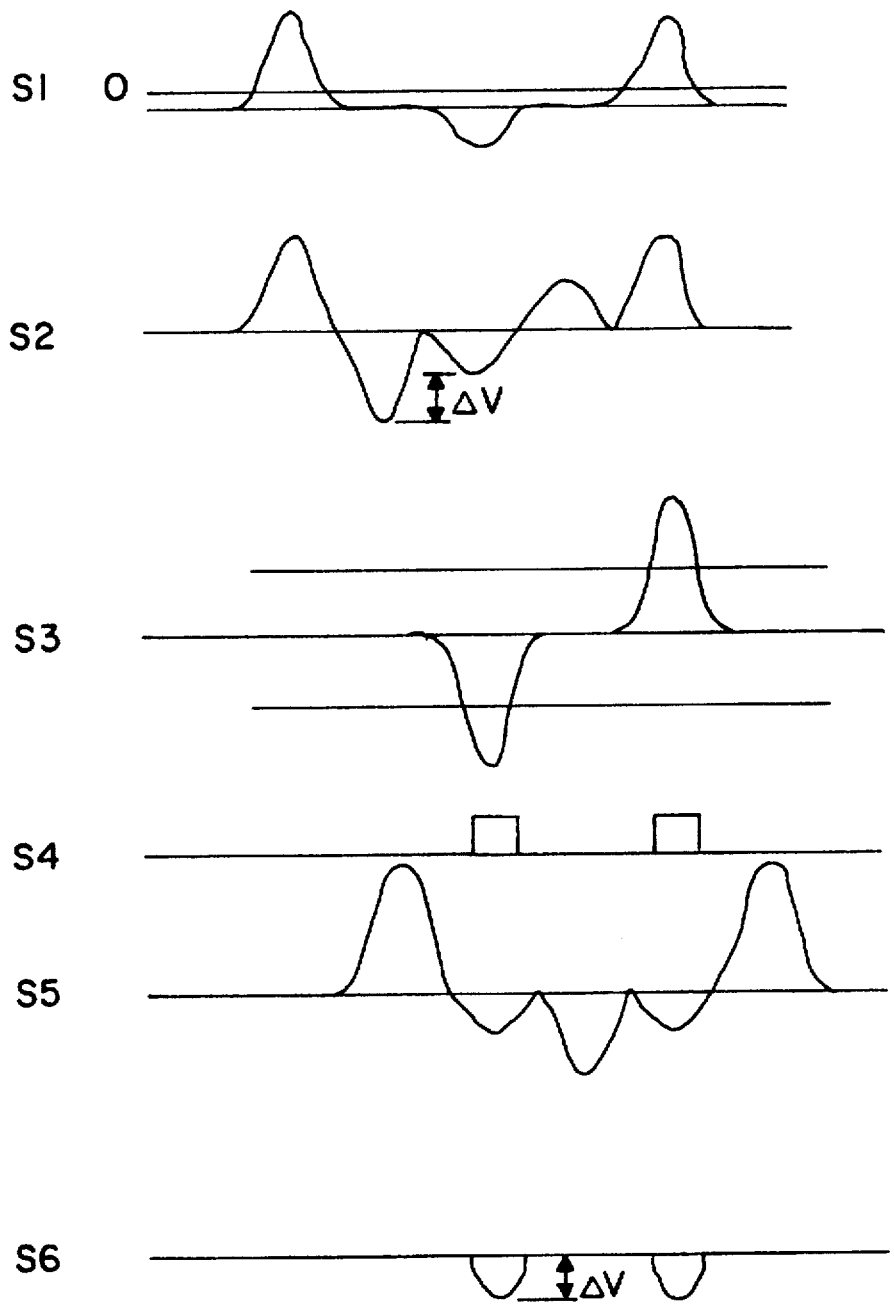
FIG. 4 is a diagram showing a waveform when $\alpha < 1$ in FIG. 1.

FIG. 1 is a block diagram illustrating one embodiment of an asymmetrical signal detector according to the present invention. FIG. 2 is a diagram of assistance in explaining how an offset is eliminated. FIGS. 3 and 4 are diagrams showing waveforms of respective portions.

An asymmetrical signal detector shown in FIG. 1 is a circuit for detecting a quantity of an amplitude error between a positive signal and a negative signal with respect to asymmetrical signals. As illustrated in FIG. 1, a magnetic recording/reproducing system 1 includes a magnetic head and a magnetic disc. The magnetic head of this magnetic recording/reproducing system 1 reads data written on the magnetic disc. A read signal thereof is inputted to an AC coupling unit 2. The AC coupling unit 2 is constructed of an amplifier and a filter. A signal from the AC coupling unit 2 is inputted to an asymmetrical signal detection circuit 5.

The asymmetrical signal detection circuit 5 includes a first delay circuit 10 for delaying an input signal S1 from the AC coupling unit 2 by T1/2 and a first subtracter circuit 11 for subtracting an output of the first delay circuit 10 from the input signal S1. An output S2 of the first subtracter circuit 11 turns out a signal wherein an offset is eliminated. Note that T1 indicates an interval between a positive signal and a negative signal with respect to the input signals.

The asymmetrical signal detection circuit 5 further includes a second delay circuit 12 for delaying the output S2 of the first subtracter circuit 11 by T1/2, an adder circuit 13 for adding the output S2 of the first subtracter circuit 11 to an output of the second delay circuit 12 and a determining circuit 14 for comparing an output S3 of the adder circuit 13 with a predetermined threshold value and generating a gate signal S4.

The asymmetrical signal detection circuit 5 furthermore includes a third subtracter circuit 15 for subtracting the output of the second delay circuit 12 from the output S2 of the first subtracter circuit 11 and a selection circuit 16 for selecting an output S5 of the third subtracter circuit 15 by a gate signal S4. An output S6 of this selection circuit 16 is an amplitude error signal indicating a quantity of an amplitude error between the positive and negative signals.

First, an operation of eliminating the offset will be explained. As illustrated in FIG. 2, a regenerative signal generated by a single magnetizing inversion is set as a time function h(t). Then, when a maximum amplitude value of a plus pole is 1, a maximum amplitude value of a minus pole is α times as large as the former value. Besides, corresponding peaks thereof are spaced by the above time T1 away from each other. Further, an offset V0 is produced due to an asymmetrical signal amplitude between the positive and negative signals.

Accordingly, an input signal indicated by fa(t) is expressed by the following formula:

$$fa(t)=h(t)-\alpha h(t-T1)+V0(t) \qquad (1)$$

Considered next is a signal fb(t) obtained by subtracting a signal delayed by Td from the input signal. This signal fb(t) is expressed by the following formula:

$$fb(t)=fa(t)-fa(t-Td) \qquad (2)$$

The formula (2) is expanded into:

$$fb(t) = h(t)-h(t-Td)-\alpha\{h(t-T1)-h(t-T1-Td)\} + \\ V0(t)-V0(t-Td) \qquad (3)$$

Herein, it can be assumed that if a time constant of the AC coupling unit is much larger than the time T1, the offset quantity is substantially fixed irrespective of the time. Namely, the following formula (4) is to be established.

$$V0(t)=V0(t-Td) \qquad (4)$$

When substituting this formula into the formula (3), the following formula (5) is obtained.

$$fb(t) = h(t) - h(t - Td) - \alpha\{h(t - T1) - h(t - T1 - Td)\} \qquad (5)$$

That is, there is obtained the signal fb(t) in which the offset is eliminated.

Thus, the signal with the offset eliminated is generated, thereby making it possible to detect the positive/negative amplitude error quantity, the offset quantity and the positive/negative amplitude quantities.

Next, the positive/negative amplitude error quantity will be described with reference to FIGS. 3 and 4. As illustrated in FIG. 3, when the first subtracter circuit 11 subtracts a signal obtained by delaying the input signal S1 by time T1/2 from the input signal S1, there is obtained a signal S2 from which the offset is removed.

Next, the second delay circuit 12 generates a signal wherein the signal S2 is further delayed by time T1/2. The adder circuit 13 adds this signal to the signal S2, thereby obtaining a signal S3. The determining circuit 14 slices the signal S3 by threshold values Vth and −Vth, a gate signal S4 is obtained.

On the other hand, the third subtraction circuit 15 subtracts an output signal of the second delay circuit 12 from the signal S2, thereby obtaining a signal S5. When the selection circuit 16 selects this signal S5 with the gate signal S4, a between-positive-and-negative amplitude error signal S6 is obtained.

In this constructive example, as shown in FIG. 3, when $\alpha>1$ (when the negative-side signal is large), the error signal S6 appears on the positive side. Whereas when as shown in FIG. 4, $\alpha<1$, (when the positive-side signal is large), the error signal S6 appears on the negative side. This error signal changes in accordance with a positive/negative asymmetrical difference.

In this way, a positive/negative amplitude error quantity of the asymmetrical signal is obtained. Further, the signal with the offset eliminated is generated, and, the positive/negative amplitude error quantity is obtained based on this signal. Therefore, an accurate amplitude error quantity is acquired.

Figure 5:
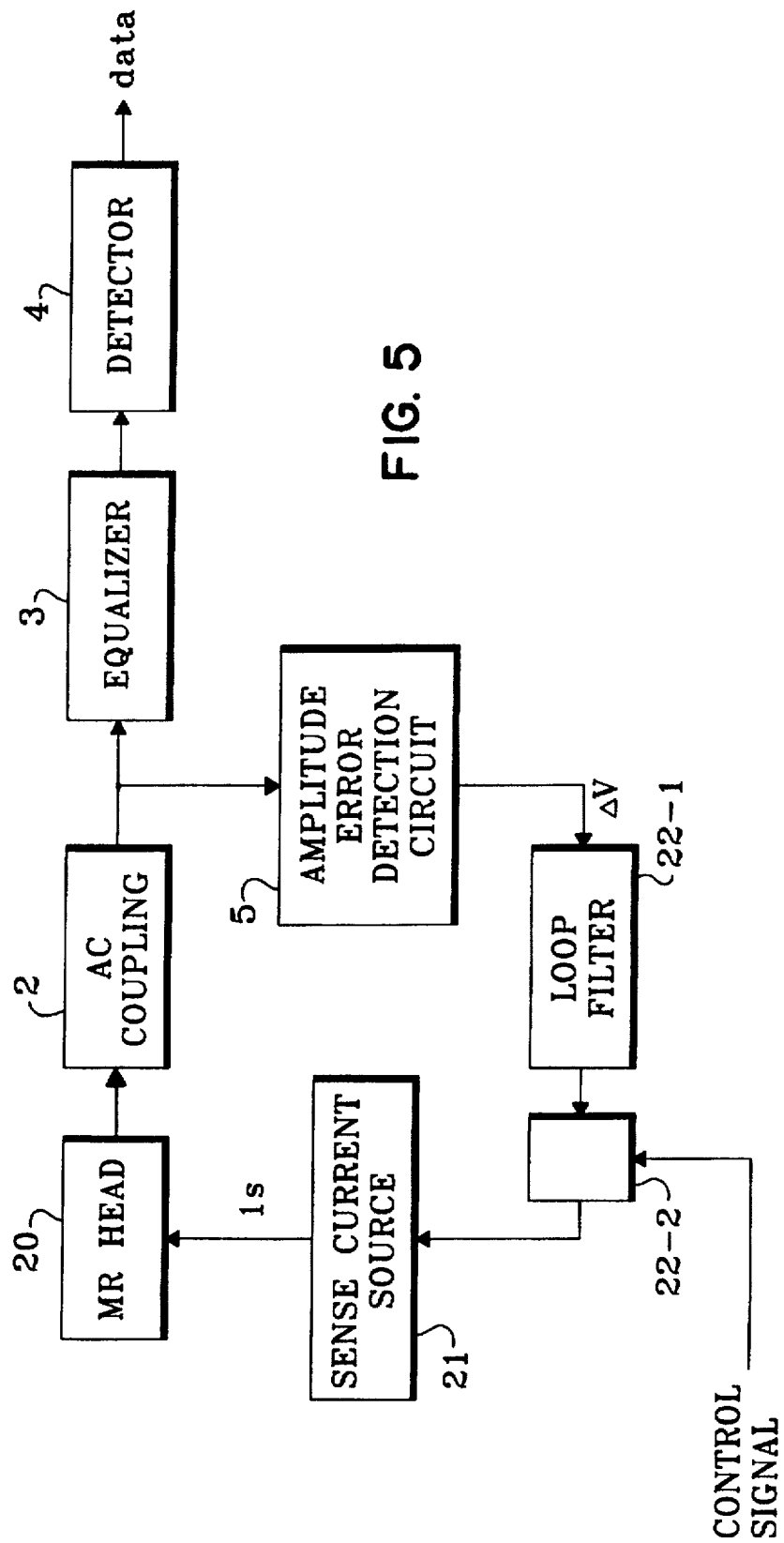
FIG. 5 is a diagram illustrating a construction of a first embodiment of a signal regenerating apparatus of the present invention.
Figure 6A:
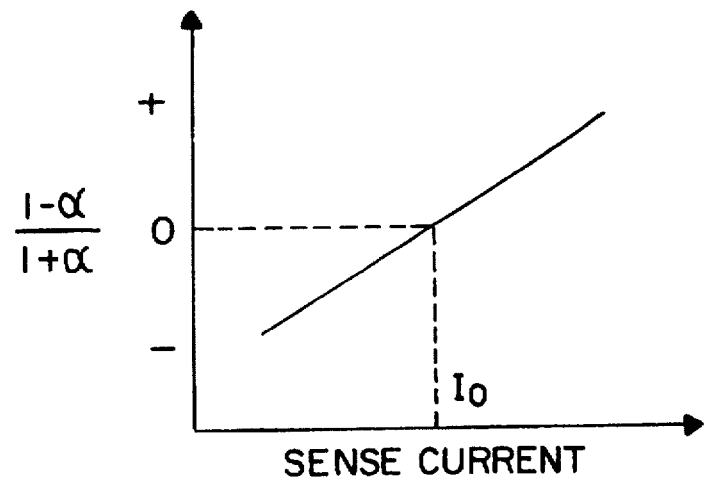
FIGS. 6A and 6B are characteristic diagrams showing asymmetry in the construction of FIG. 5.
Figure 6B:
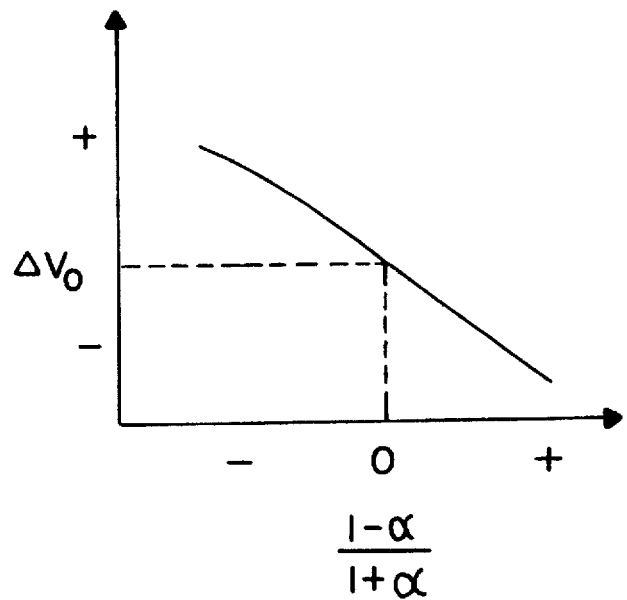

Described next is a compensating apparatus for asymmetry, which uses this amplitude error detection circuit 5. FIG. 5 is a block diagram showing a first example of a signal regenerating apparatus according to the present invention. FIGS. 6A and 6B are characteristic diagrams of the asymmetry. FIG. 5 illustrates the signal regenerating apparatus for compensating the asymmetry of an MR head.

Figure 24A:
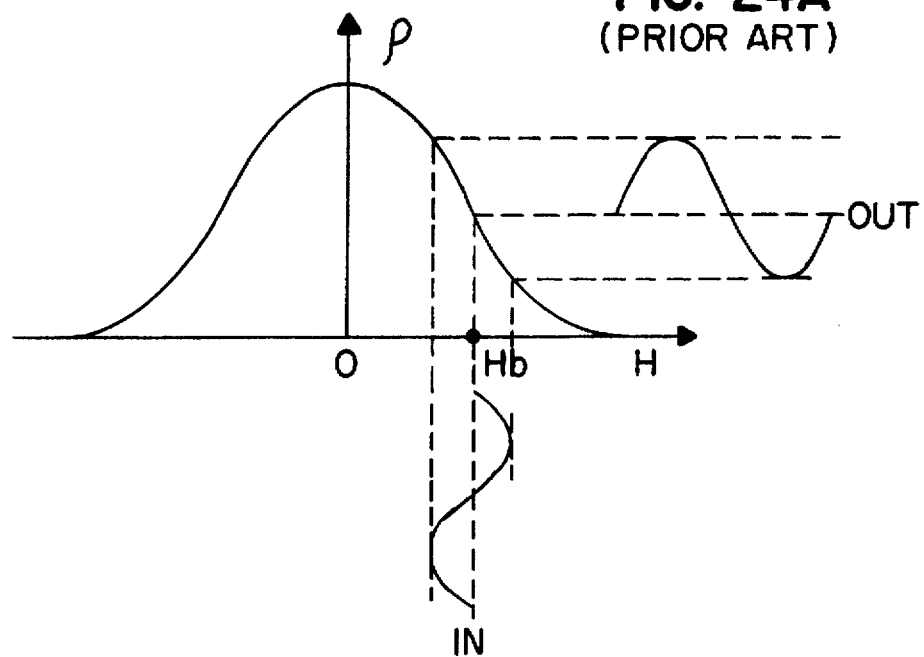
FIGS. 24A and 24B are diagrams of an operating principle of an MR head but showing the prior art.
Figure 24B:
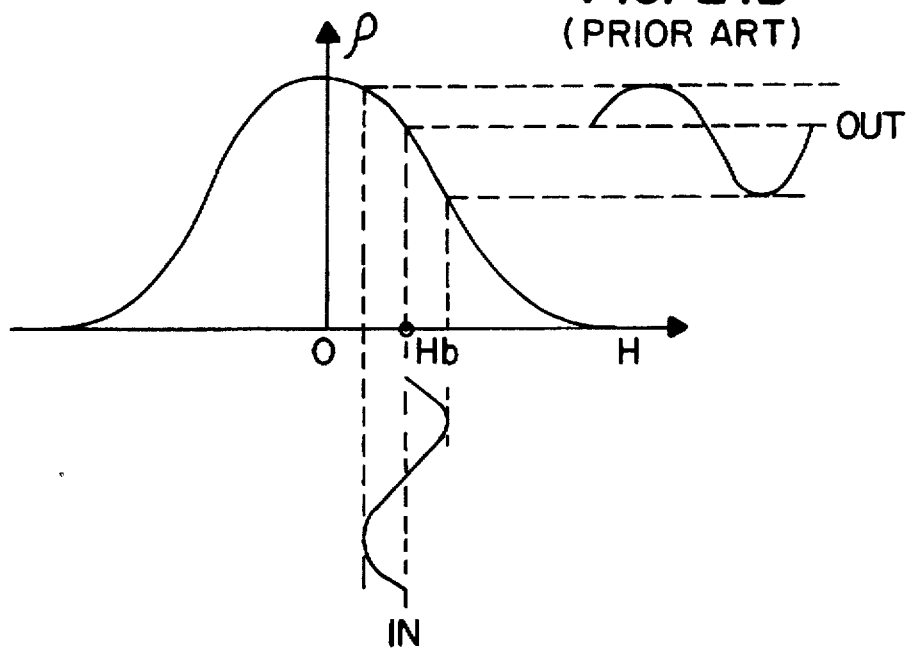
Figure 25:
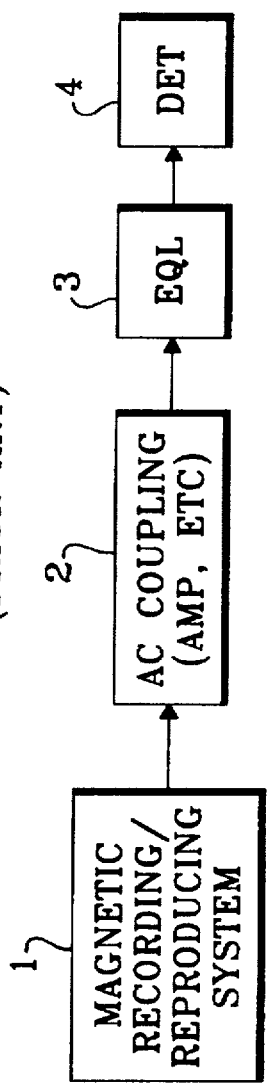
FIG. 25 is a diagram illustrating a construction of the prior art.
Figure 26:
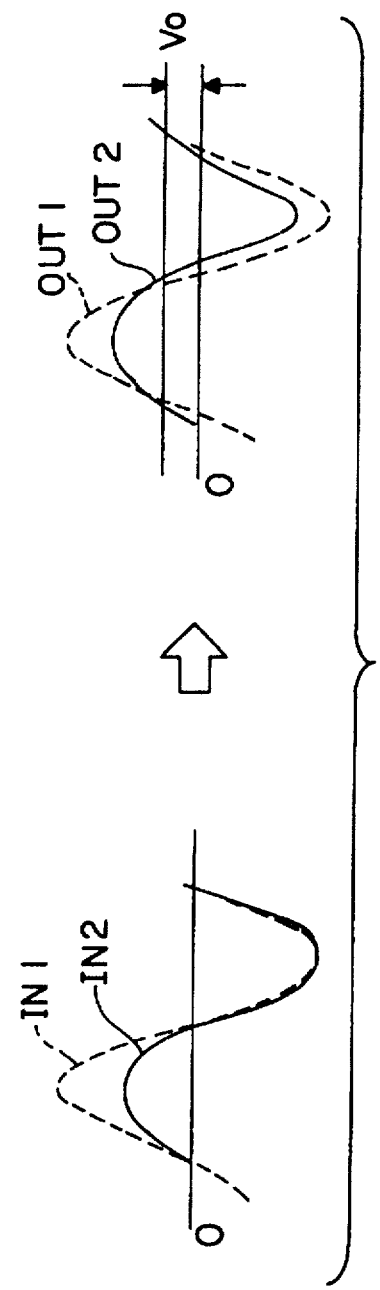
FIG. 26 is an explanatory diagram showing an offset in the prior art.

A electric current flows across the MR head in order to convert a variation rate of a resistance that corresponds to recording magnetization into an electrical signal. This is known as a sense current. A bias shown in FIGS. 24A and 24B is effected by use of this current. Accordingly, as illustrated in FIG. 6A, generally, the positive/negative asymmetry changes depending on a value of the sense current. As depicted in FIG. 6A, when a sense current value Is is I0, $\alpha=1$, and the positive/negative symmetry is attained.

Hence, it is possible to adjust the asymmetry by regulating the sense current. There is a scatter in the characteristic thereof depending on the head, requiring, separate adjustment for every head.

As illustrated in FIG. 5, a read signal of the MR head 20 is inputted to the AC coupling unit 2. A signal of the AC coupling unit 2 is inputted to an waveform equalizer 3, wherein the waveforms are equalized. The waveform equalizer 3 is constructed of, e.g., a transversal equalizer. An output of the waveform equalizer 3 is inputted to a data detector 4. The data detector 4 detects pieces of data [1], [0] from the outputs of the waveform equalizer 3. This data detector 4 is constructed of, e.g., a maximum likelihood detector (Viterbi detector).

The amplitude error detection circuit 5 illustrated in FIG. 1 outputs the amplitude error signal S6 ($\Delta V$) from the signal S1 of the AC coupling unit 2. As shown in FIG. 6B, a relationship of the asymmetry quantity versus the amplitude error $\Delta V$ is linear. Accordingly, when the signal is symmetrical, the amplitude error $\Delta V$ becomes zero.

Then, a sense current value of a sense current source 21 of the MR head 20 is controlled based on the amplitude error $\Delta V$. That is, the sense current value is made automatically approximate to an optimum value I0 so that the asymmetrical quantity becomes zero.

Herein, a loop filer 22-1 is provided for performing a smooth adjustment. This loop filter 22-1 involves the use of a low-pass filter constructed of a resistor and a capacitor.

A register 22-2 for holding an output of the loop filter 22-1 is provided for a reason which follows. That is, for obtaining the amplitude error quantity by eliminating the offset explained in FIGS. 2 and 3, it is required that any interference does not exist between the positive and negative signals. Such signals can not be obtained from the data signals. Then, the positive and negative signals with no interference are set in a training signal provided anterior to the data signal.

Accordingly, during a training period for which the training signal is being read, a control signal works to make the register 22-2 hold a control quantity corresponding to the amplitude error quantity. Subsequently, during a data period of the data signal, the sense current value of the MR head 20 is controlled based on the thus held control quantity.

That is, the input signals including the training signal and the data signal are used. Then, the amplitude error quantity is detected by the training signal, and the control quantity is held. With respect to the data signal, the sense current value of the MR head 20 is set by the held control quantity.

Thus, it is possible to regenerate the signal wherein the asymmetric characteristic of the MR head 20 is compensated. Further, the control quantity is detected from the input signal defined as an input of the equalizing circuit but undergoing no waveform control, and, therefore, the control quantity can be exactly obtained.

Figure 7:
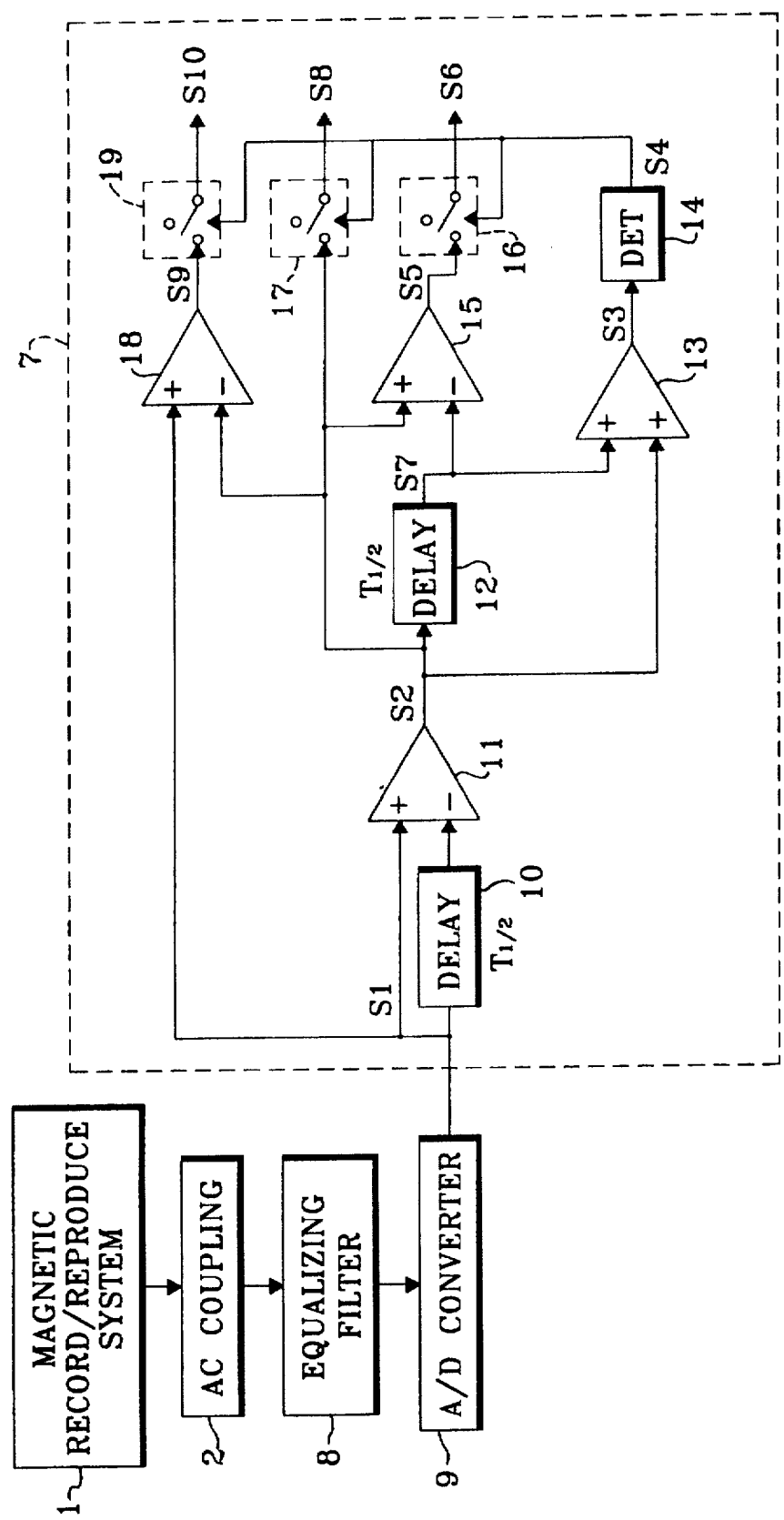
FIG. 7 is a diagram illustrating a construction of another embodiment of the asymmetrical signal detector.
Figure 8:
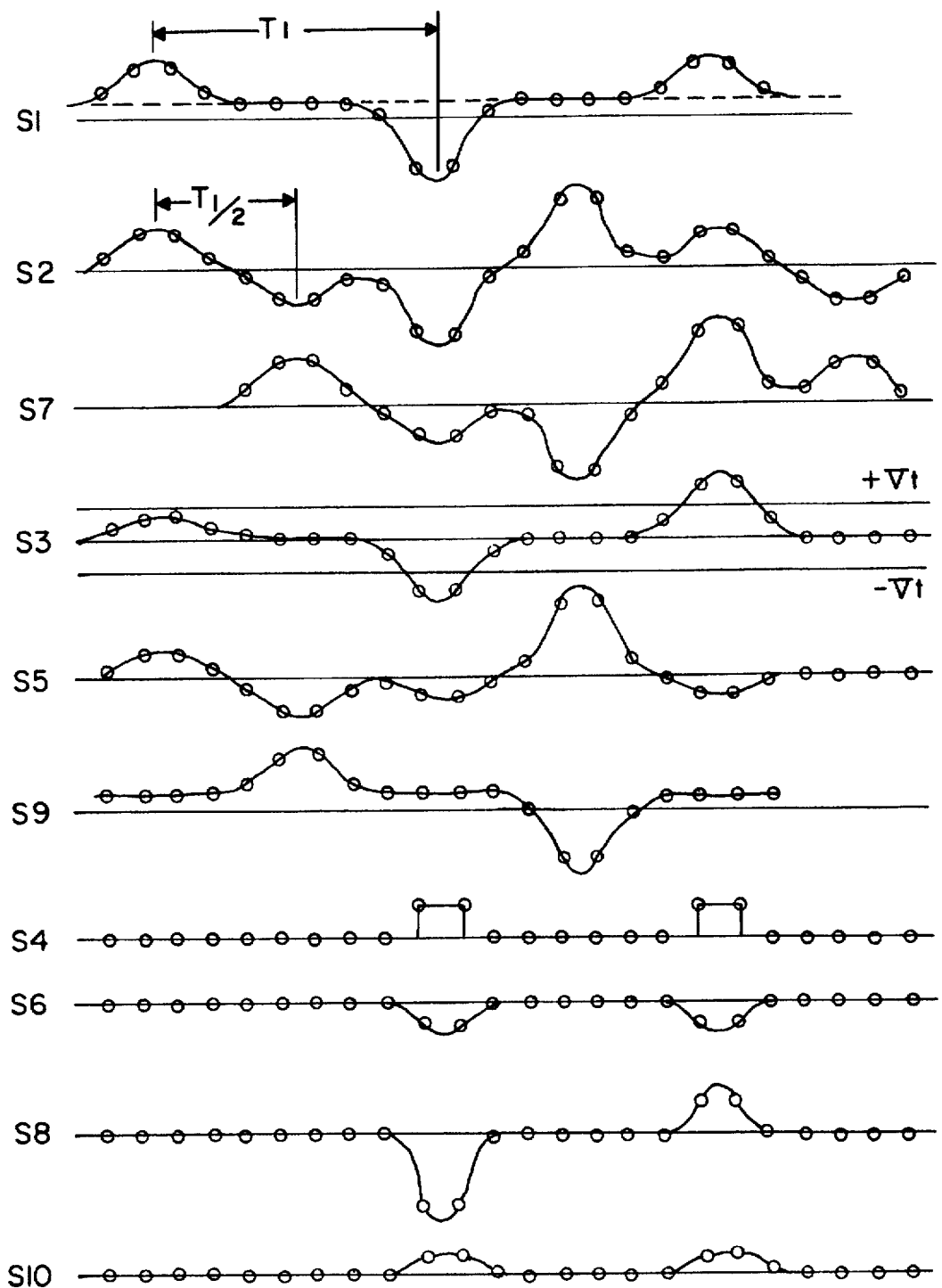
FIG. 8 is a diagram showing a waveform in the construction of FIG. 7.

FIG. 7 is a block diagram showing another example of the asymmetrical signal detector of the present invention. FIG. 8 is a diagram showing waveforms of the respective portions. FIG. 7 shows the example of being applied to discrete signal process by an A/D converter. FIG. 7 also shows sampling which counts on a (1+D) equalization in a partial response used for a recent magnetic disk device, etc. Note that the symbol D represents a delay element.

Referring to FIG. 7, the same components as those shown in FIG. 1 are marked with the like symbols. As illustrated in FIG. 7, the asymmetric signal detection circuit 7 includes the first delay circuit 10, the first subtracter circuit 11, the second delay circuit 12, the adder circuit 13, the determining circuit 14, the third subtraction circuit 15 and the first selection circuit 16. Then, with this construction, as described in FIG. 1, the amplitude error signal S6 is outputted.

This asymmetrical signal detection circuit 7 has a second selection circuit 17 for selecting the output signal S2 of the first subtracter circuit 11 by use of the gate signal S4. An output signal S8 of the second selection circuit 17 indicates each of positive/negative amplitude values.

Further, the asymmetrical signal detection circuit 7 has a second subtraction circuit 18 for subtracting the output signal S2 of the first subtracter circuit 11 from the input signal S1 and a third selection circuit 19 for selecting an output signal S9 of the second subtracter circuit 18 by use of the gate signal S4. An output signal S10 of the third selection circuit 19 indicates an offset quantity.

Note that the numeral 8 designates an equalizing filter for filtering the output of the AC coupling unit 2. Further, the numeral 9 represents an A/D converter for converting an analog output of the equalizing filter 8 into a digital value.

The operation thereof will be explained with reference to FIG. 8. As explained in FIG. 1, the first selection circuit 16 selects the output signal S5 of the third subtracter circuit 15 by use of the gate signal S4, thereby obtaining the amplitude error signal S6 between positive and negative peaks.

Also, the second selection circuit 17 selects the gate signal S4 by use of the output signal S2 of the first subtracter circuit 11, thereby obtaining each of the signal positive/negative amplitude value signals S8.

Further, the third selection circuit 19 selects the output signal S9 of the second subtracter circuit 18 by use of the-gate signal S4, thereby obtaining the signal offset quantity signal S10.

In this embodiment also, the signal with the offset eliminated is generated, and, the positive/negative amplitude value and the offset quantity are obtained based on this signal. Hence, the accurate amplitude value and offset quantity are acquired.

FIG. 9 is a block diagram showing a second embodiment of the signal regenerating apparatus of the present invention. In accordance with this embodiment, the signal offset is eliminated by a feed forward loop.

Referring to FIG. 9, the same components as those shown in FIGS. 5 and 7 are marked with the like symbols. As illustrated in FIG. 9, the output signal S1 of the A/D converter 9 is inputted to an offset detection circuit 7-1. The offset detection circuit 7-1 is an asymmetrical signal detection circuit shown in FIG. 7. Note that this offset detection circuit 7-1 is needed only for detecting the offset quantity, and hence the third subtracter circuit 15 and the selection circuits 16, 17 among those constructive elements illustrated in FIG. 7 are deleted.

The offset detection circuit 7-1, as stated above, outputs the offset quantity signal S10 from the input signal S1. This signal S10 and the gate signal S4 are inputted to an averaging circuit 21. The averaging circuit 21 is a circuit for removing noises overlapped on a head regenerative signal.

This averaging circuit 21 includes an adder circuit for accumulating the offset quantity signals S10, a counter for counting the gate signals S4, a division circuit for dividing an added value of the adder circuit by a count value (sample value) of the counter and a register for holding an output of the division circuit.

A subtracter circuit 22 subtracts this averaged offset signal S12 from the output S1 of the A/D converter 9.

Thus, the offset quantity is detected, and the offset quantity is subtracted from the data signal, whereby the offset can be compensated.

It is to be noted that the control signal serves to cause the register of the averaging circuit 21 to hold the offset average value. This implies, as discussed above, that no interference is required to exist between the positive and negative signals in order to obtain the offset quantity explained in FIGS. 2 and 3. Such signals can not be obtained from the data signals. Then, the positive and negative signals with no interference are set in the training signal provided anterior to the data signal.

Accordingly, during the training period, the control signal works to make the register hold the control quantity corresponding to the offset quantity. Subsequently, during the data period of the data signal, the output of the A/D converter 9 is compensated based on the thus held control quantity.

That is, the input signals including the training signal and the data signal are used. Then, the offset quantity is detected by the training signal, and the control quantity is held. With respect to the data signal, the output of the A/D converter is compensated by the thus held control quantity.

Figure 11:
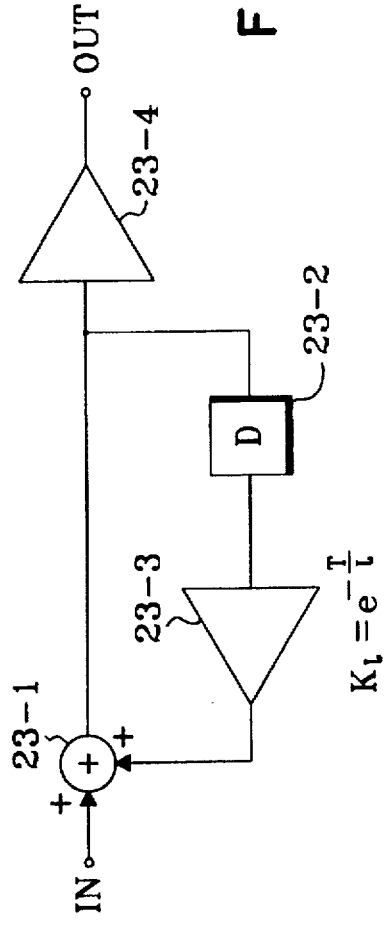
FIG. 11 is a diagram illustrating a configuration of a loop filter in the construction of FIG. 10.

FIG. 10 is a block diagram showing a third embodiment of the signal regenerating apparatus of the present invention. FIG. 11 is a block diagram of a loop filter shown in FIG. 10. In accordance with this embodiment, the signal offset is eliminated by a feedback loop.

Referring to FIG. 10, the same components as those shown in FIG. 9 are marked with the like symbols. As illustrated in FIG. 10, the output signal S1 of the A/D converter 9 is inputted to the offset detection circuit 7-1. The offset detection circuit 7-1 is the asymmetrical signal detection circuit shown in FIG. 7. Note that this offset detection circuit 7-1 is needed only for detecting the offset quantity, and hence the third subtracter circuit 15 and the selection circuits 16, 17 among those constructive elements illustrated in FIG. 7 are deleted.

The offset detection circuit 7-1, as stated above, outputs the offset quantity signal S10 from the input signal S1. This signal S10 is inputted to a loop filter 23. The loop filter 23 is a known digital lag filter.

As illustrated in FIG. 11, the loop filter 23 is constructed of an adder circuit 23-1, a delay circuit 23-2 for delaying an output of the adder circuit 23-1, a first multiplying circuit 23-3 for multiplying an output of the delay circuit 23-2 by a gain Kτ, a second multiplying circuit 23-4 for multiplying an output of the adder circuit 23-1 by a gain Kg and an unillustrated register for holding an output of the second multiplying circuit 23-4.

The gain Kτ of the first multiplying circuit 23-3 is set to a value which does not exceed [1], thereby performing the same operation as that of the analog loop filter shown in FIG. 5. Accordingly, the loop filter has the same function as that shown in FIG. 5. Note that the gain Kg of the second multiplying circuit 23-4 serves to adjust the whole gain.

The subtraction circuit 24 subtracts an output of the loop filter 23 from the output of the A/D converter 9. The signal with the offset eliminated is thereby obtained.

It is to be noted that the control signal serves to cause the register of the loop filter 23 to hold the offset value. This implies, as discussed above, that no interference is required to exist between the positive and negative signals in order to obtain the offset quantity explained in FIGS. 2 and 3. Such signals can not be obtained from the data signals. Then, the positive and negative signals with no interference are set in the training signal provided anterior to the data signal.

Accordingly, during the training period, the control signal works to make the register hold the control quantity corresponding to the offset quantity. Subsequently, during the data period of the data signal, the output of the A/D converter 9 is compensated based on the thus held control quantity.

That is, the input signals including the training signal and the data signal are used. Then, the offset quantity is detected by the training signal, and the control quantity is held. With respect to the data signal, the output of the A/D converter is compensated by the thus held control quantity.

Figure 12:
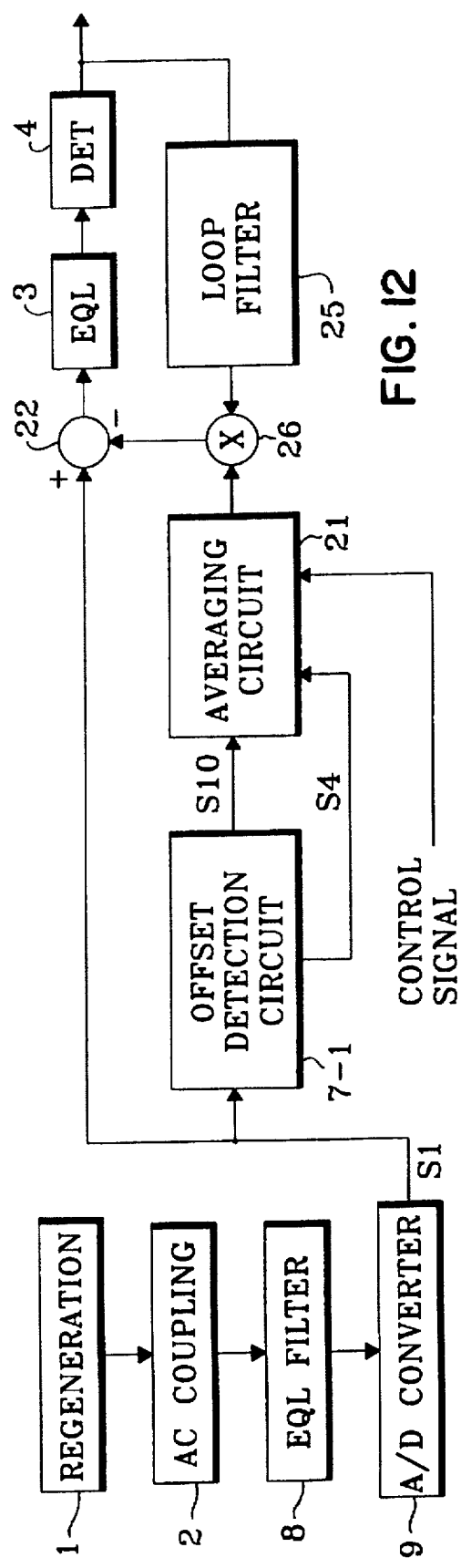
FIG. 12 is a diagram illustrating a construction of a fourth embodiment of the signal regenerating apparatus of the present invention.
Figure 13:
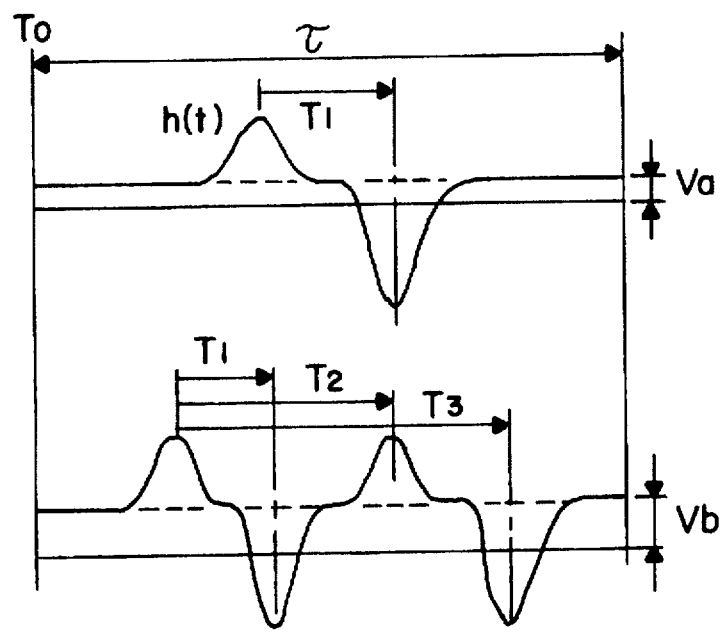
FIG. 13 is a explanatory diagram of a relationship of a magnetizing inversion density versus an offset but showing a modified embodiment of FIG. 12.

FIG. 12 is a block diagram illustrating a fourth embodiment of the signal regenerating apparatus of the present invention. FIG. 13 is a diagram showing a relationship a magnetizing inversion density versus an offset.

FIG. 13 shows a case where one pair of positive/negative signals, i.e., two magnetizing inversions exist in a range of a time interval τ. Let Va be the offset quantity at this time. Within this time interval τ, the following formula (6) is established:

Herein, it is assumed that the offset quantity is $$\int_{T0}^{T0+\tau} \{h(t) - \alpha \cdot h(t-T1) + Va\}dt = 0 \tag{6}$$

fixed, the formula (6) is rewritten into the following formula (7):

$$\int_{T0}^{T0+\tau} h(t)dt - \alpha \int_{T0}^{T0+\tau} h(t-T1)dt + Va \cdot \tau = 0 \tag{7}$$

On the other hand, as shown in the lower portion of FIG. 13, it is considered that two pairs of positive/negative signals (four magnetizing inversions) exist in the time interval τ.

Let Vb be the offset quantity at this time, and the following formula (8) is established:

$$\int_{T0}^{T0+\tau} \{h(t) - \alpha \cdot h(t-T1) + h(t-T2) - \alpha \cdot h(t-T3) + Vb\}dt = 0 \tag{8}$$

Herein, the signal is a repetitive signal, and it is therefore considered that an interference quantity from within the signal range of the time τ to outside the signal range is the same as an interference quantity from outside the signal range to within the signal range. Accordingly, an integral value of one signal within the time τ can be given in the following formula (9);

$$\int_{T0}^{T0+\tau} h(t)dt = \int_{T0}^{T0+\tau} h(t-Ti) = H \tag{9}$$

When this formula (9) is substituted into the formula (8), the formula (10) is obtained:

$$Vb = 2(H - \alpha H)/\tau = 2Va \tag{10}$$

From the above, it is considered that the offset quantity fluctuates in proportion to the number of the positive/negative signals (the number of the magnetizing inversions). Then, FIG. 12 illustrates a circuit for compensating the offset while predicting the fluctuations thereof.

Referring to FIG. 12, the same components as those shown in FIG. 9 are marked with the like symbols. As depicted in FIG. 12, the detection data of the data detector 4 are inputted to a loop filter 25. Data [1] is recorded corresponding to the magnetizing inversion. Therefore, the loop filter 25 outputs the number of data [1] within the time interval τ corresponding to a time constant thereof, i.e., a value proportional to the number (density) of the magnetizing inversions.

FIG. 11 illustrates a configuration of this loop filter 25. If a data string has the same number (density) of the data [1] as that of the training patterns, it is required that the gain and the time constant of the loop filter 25 be adjusted so that the output value of the loop filter 25 becomes 1.

The multiplying circuit 26 multiplies the output of the loop filter 25 by an offset average value of the averaging circuit 21. The subtracter circuit 22 subtracts an output of the multiplying circuit 26 from the output of the A/D converter 9. With this process, there is obtained a signal in which the offset quantity changing depending on the data string is eliminated.

In this embodiment also, during the training period, the control quantity corresponding to the offset quantity is held by the averaging circuit 21. Then, during the data period of the data signal, the thus held control quantity is changed in accordance with the number of the data [1] in the data string, thereby preparing the control quantity. The output of the A/D converter 9 is compensated based on the control quantity in accordance with the number of the data [1].

That is, the input signals including the training signal and the data signal are used. Then, the offset quantity is detected by the training signal, and control quantity is held. With respect to the data signal, the output of the A/D converter is compensated by the thus held control quantity and the number of the data [1] in the data string.

Figure 14:
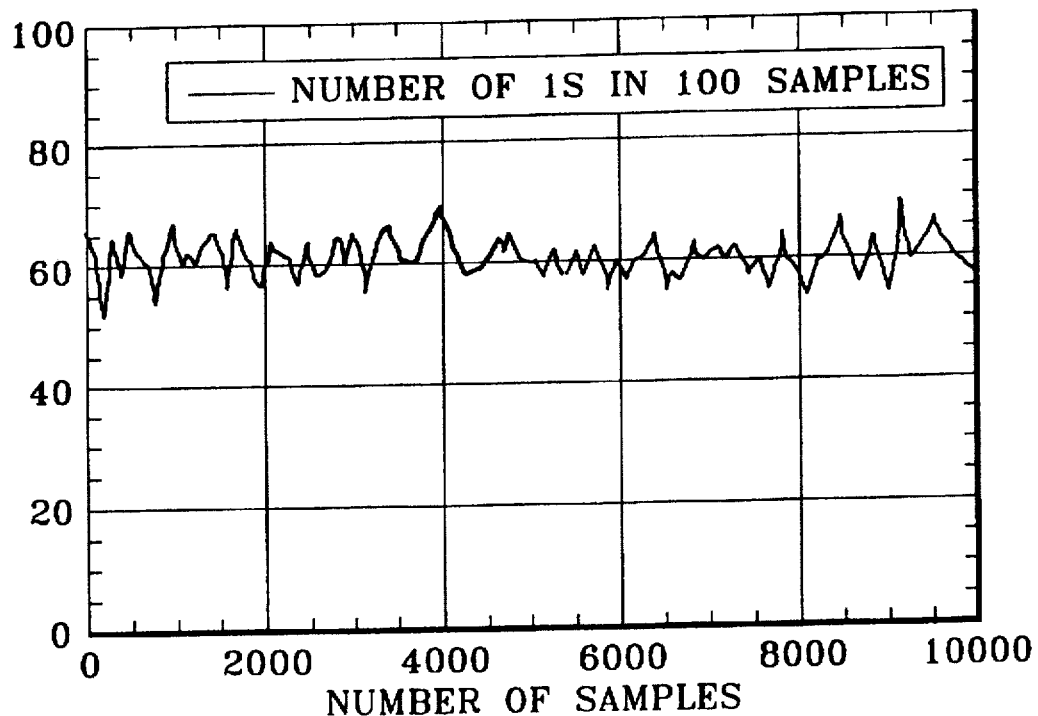
FIG. 14 is a statistic diagram of data when using a 8/9 conversion but showing the modified embodiment of FIG. 12.

FIG. 14 is a statistic chart, showing data when using a 8/9 conversion, of assistance in explaining a modification of the embodiment of FIG. 9.

The magnetic disc device in recent years uses a method of pseudo-randomizing the record data with respect to an M-series or the like. Accordingly, when a cut-off frequency of the AC coupling is low (when the time constant is large), it is considered that a variation in terms of the number of the data [1] in the record data within the time constant thereof is small.

Then, in the magnetic storage device, there is statically obtained a rate (probability) of the data [1] (magnetizing inversions) of generative codes when the input is set at random in generally employed RLL (Run Length Limited) codes. Subsequently, a rate of the data [1] in the training signals is adjusted to the former rate. With this processing, the offset fluctuating depending on a frequency of the data [1] in the data string can be properly compensated.

FIG. 14 is a statistic chart showing a case where the record data are conceived to be random, and the 8/9 (0, 4, 4) coding is used for the input signal. That is, the record data (data string) are segmented on the unit of 100 samples, and the number of the data [1] therein is obtained.

In the memory device at the present time, the cut-off frequency of the AC coupling extends to several hundred KHz through several MHz, while a bit frequency (inverse number of bit period) extends to several ten MHz through several hundred MHz. Hence, the bit frequency is more than 100 times as large as the cut-off frequency, and it is appropriate that the record data are segmented in the unit of 100 samples.

Incidentally, for more information about the 8/9 (0, 4, 4) coding, refer to U.S. Pat. No. 4,707,681.

As illustrated in FIG. 14, the number of the data [1] falls within a range of 60±10 among 100 pieces of data. Accordingly, in a signal pattern after being encoded on the magnetic recording medium, there is such a training pattern that a number-of-samples n of the whole and a number-of-data [1] m are in a relationship such as m/n=0.6. The offset is thereby detected and then compensated. With this processing, in an arbitrary data pattern also, an offset compensation error due to the data fluctuations falls within a ±10% range.

Figure 15:
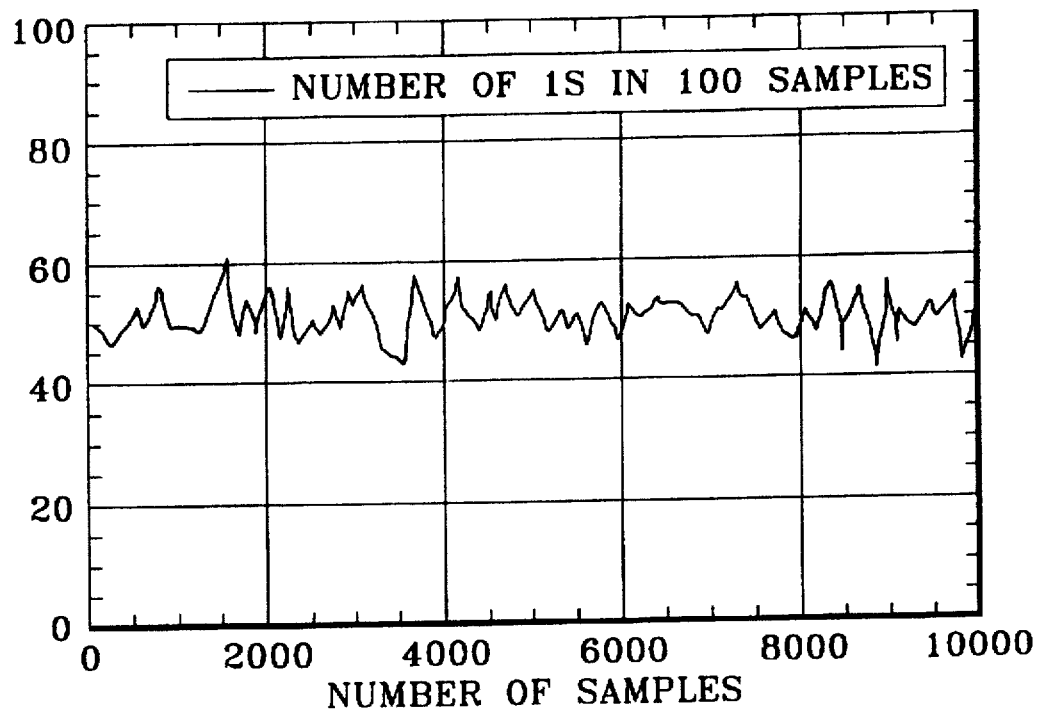
FIG. 15 is a statistic diagram of the data when using a pre-coder but showing another modified embodiment of FIG. 12.

FIG. 15 is a statistic chart, showing the data when using a pre-coder, of assistance in explaining another modification of the embodiment of FIG. 9.

FIG. 15 shows an embodiment wherein the rate of the data [1] of the training signals changes as done in FIG. 14. FIG. 15 is a statistic chart showing a case where after performing the 8/9 (0, 4, 4) coding, a 1/(1+D) precoder is incorporated, and the recording is carried out. Note that the symbol [D] represents a delay element.

As shown in FIG. 15, the number of the data [1] falls within a range of 50±10 among 100 pieces of data.

Accordingly, in the signal pattern after being encoded on the magnetic recording medium, there is such a training pattern that the number-of-samples n of the whole and the number-of-data [1] m are in a relationship such as m/n=0.5. The offset is thereby detected and then compensated. With this processing, in an arbitrary data pattern also, the offset compensation error due to the data fluctuations falls within the ±10% range.

Figure 16:
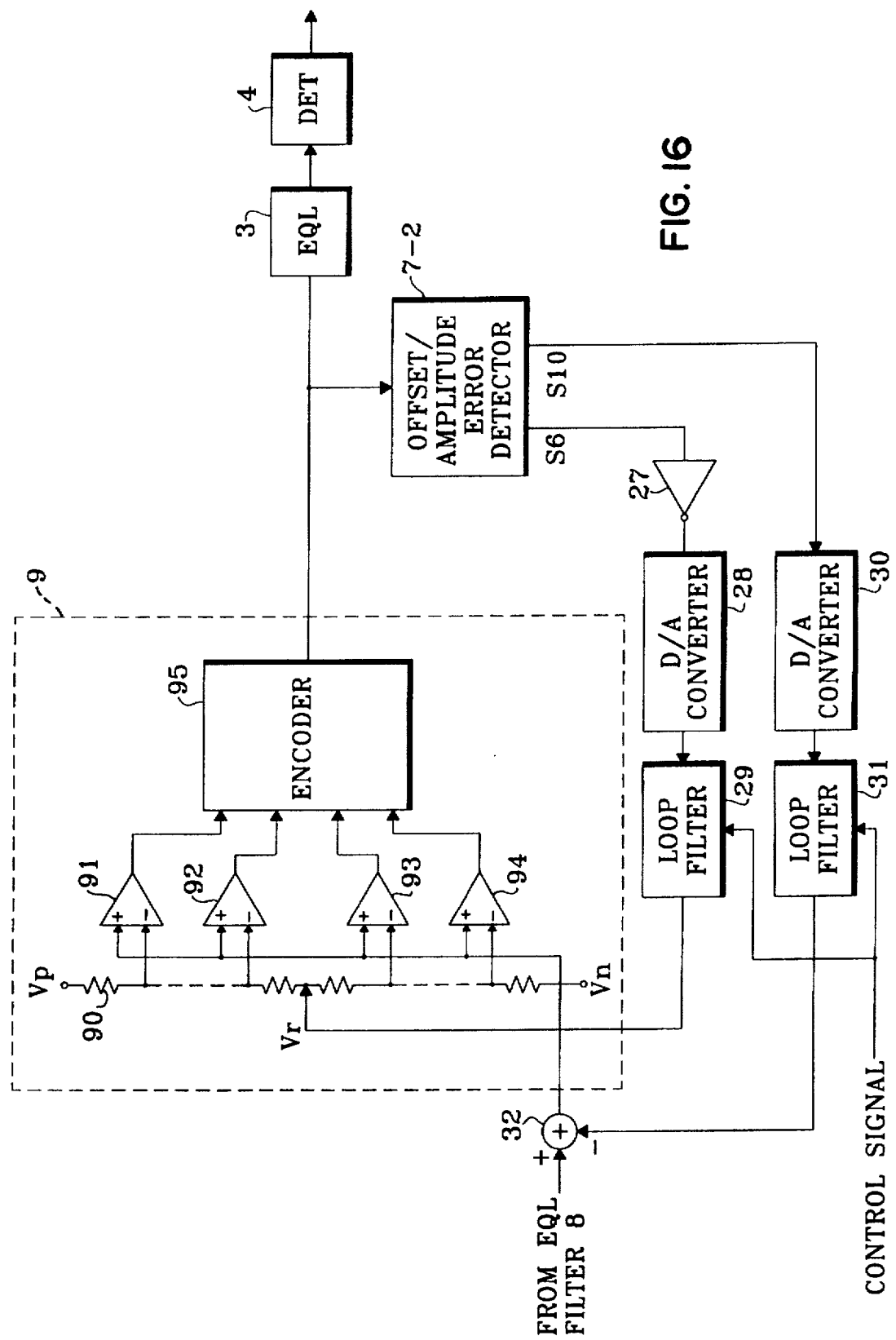
FIG. 16 is a diagram illustrating a construction of a fifth embodiment of the signal regenerating apparatus of the present invention.
Figure 17B:
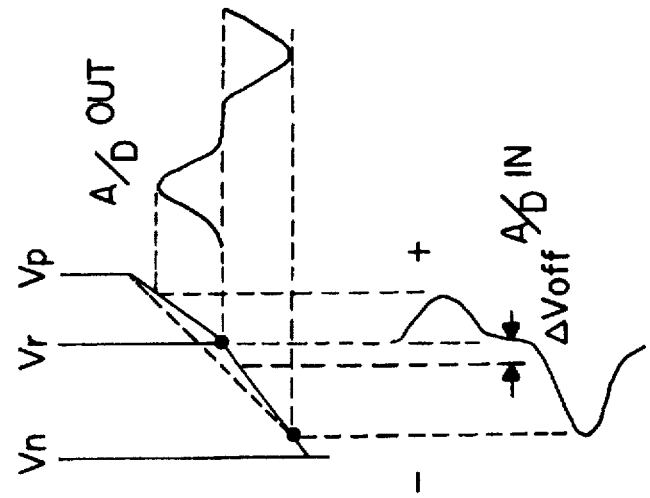
FIGS. 17A and 17B are explanatory diagrams each showing an operation in the construction of FIG. 16.
Figure 17A:
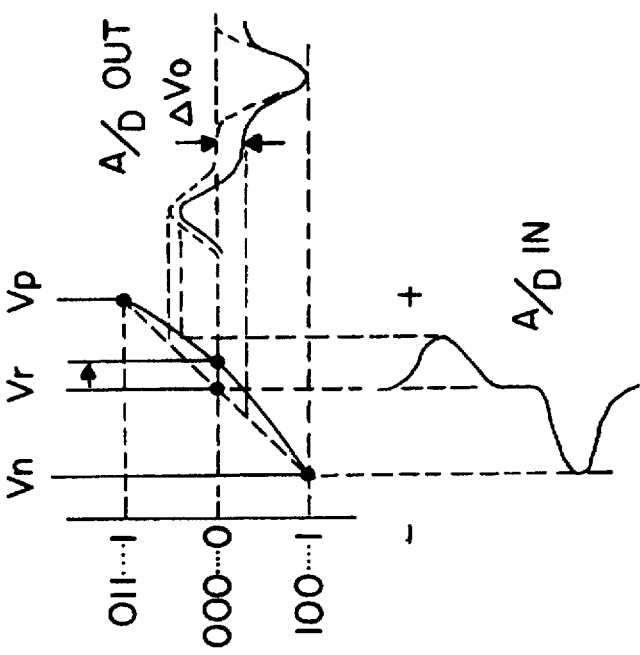

FIG. 16 is a block diagram illustrating a fifth embodiment of the signal regenerating apparatus of the present invention. FIGS. 17A and 17B are diagrams of assistance in explaining the operation in the construction of FIG. 16.

In FIG. 16, the same components as those shown in FIG. 9 are marked with the like symbols. As illustrated in FIG. 16, the A/D converter 9 is constructed of a flash-type converter. That is, the construction is that a reference voltage is given at three points Vp on the positive side, Vn on the negative side and Vr at the mid point. Then, the A/D converter 9 consists of a resistor 90, subtracters 91–94 and an encoder 95.

An offset/amplitude error detector 7-2 detects an offset value and an amplitude error from the output of the A/D converter 9. A construction of this offset/amplitude error detector 7-2 is the same shown in FIG. 7. However, the amplitude value is not needed as an output, and, therefore, the selection circuit 17 is deleted.

An inverting circuit 27 inverts the detected amplitude error value. A D/A converter 28 converts an inverted amplitude error value into an analog quantity. A loop filter 29 works to remove the noises in the amplitude error quantity. This loop filter 29 is constructed of a primary low-pass filter but includes a register for holding a value by use of the control signal. An output of this low-pass filter 29 corresponds to the mid-point voltage Vr of the A/D converter 9.

A D/A converter 30 converts the digital offset value into the analog quantity. A loop filter 31 removes the noises in the analog offset quantity. This loop filter 31 is constructed of the primary low-pass filter but includes the register for holding the value by use of the control signal. A subtracter circuit 32 subtracts an output of the loop filter 31 out of the output of the equalizing filter 8.

The operation thereof will be explained. A broken line in FIG. 17A shows a case where the mid-point voltage Vr is centered between the positive-side voltage Vp and the negative-side voltage Vn in a relationship of the output versus the input to the A/D converter 9. In this case, the positive/negative asymmetrical input signal turns out an output signal depicted by the broken like in the Figure. With respect to the asymmetrical signal wherein the negative side is larger than the positive side, the amplitude error signal S6 becomes a negative polarity signal as illustrated in FIG. 8.

Accordingly, the mid-point voltage Vr of the A/D converter 9 is compensated by a compensation signal having the polarity inverted by the inverting circuit 27. With this processing, the mid-point voltage Vr shifts toward the positive side. Therefore, the characteristic of the A/D converter 9 is that, as shown by a solid line in FIG. 17A, a positive-side inclination (gain) increases, while a negative-side inclination (gain) decreases. As a result, an A/D output becomes as shown by the solid line, and the asymmetry is compensated.

However, a new offset V0 is added. Therefore, the offset is detected, and the subtracter circuit 32 performs the subtraction. With this process, as illustrated in FIG. 17B, there is obtained an output signal wherein both of the asymmetry and the offset are compensated. In this embodiment, the subtracter circuit 32 eliminates the offset caused due to the positive/negative asymmetry.

In this embodiment also, the control signal works to make the registers of the loop filters 29 and 31 hold the amplitude error quantity and the offset value. That is, during the training period, the control signal works to cause the register to hold the control quantity corresponding to the amplitude error quantity and the offset quantity as well. Then, during the data period of the data signal, the mid-point voltage and the input of the A/D converter 9 are compensated based on the thus held control quantity. Namely, there are used the input signals including the training signal and the data signal.

Figure 18:
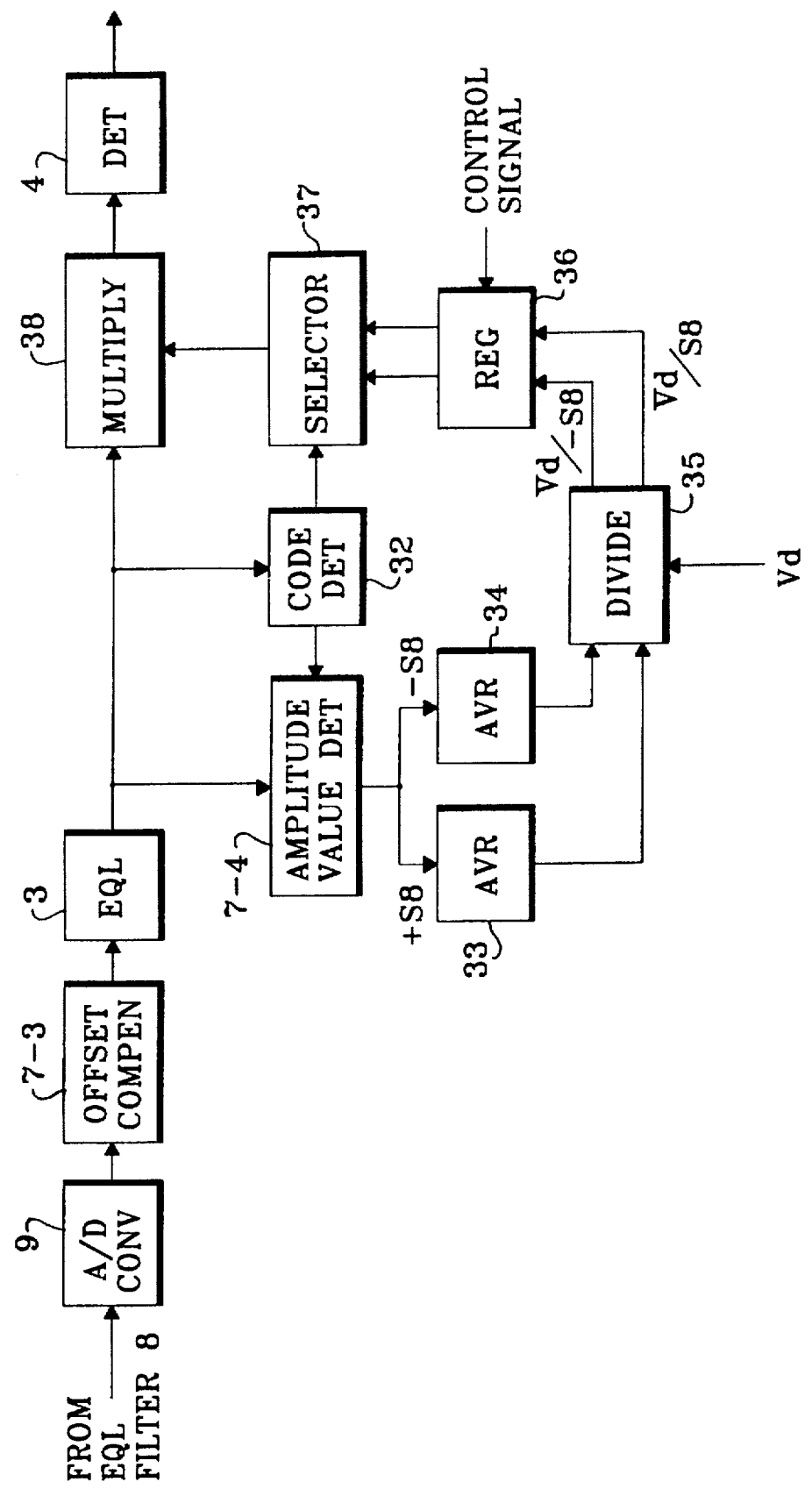
FIG. 18 is a diagram illustrating a construction of sixth embodiment of the signal regenerating apparatus of the present invention.

FIG. 18 is a block diagram illustrating a sixth embodiment of the signal regenerating apparatus of the present invention. In FIG. 18, the same components as those shown in FIG. 9 are marked with the like symbols.

As illustrated in FIG. 18, an offset compensating circuit 7-3 compensates an offset of the output of the A/D converter 9 as shown in FIG. 9. That is, the offset compensating circuit 7-3 is constructed of the offset detection circuit 7-1 shown in FIG. 9, an averaging circuit 21 and a subtracter circuit 22.

A code determining circuit 32 determines positive/negative codes of outputs of the equalizing circuit 3. For example, the code determining circuit 32 slices the output of the equalizing circuit 3 at a zero level and determines the positive and negative of the code.

An amplitude value detection circuit 7-4 is an asymmetrical signal detection circuit shown in FIG. 7. Note that this amplitude value detection circuit 7-4 is required for only detecting the amplitude value, and hence the second subtracter circuit 18, the third subtracter circuit 15 and the selection circuits 16, 19 among those constructive elements illustrated in FIG. 7 are deleted.

This amplitude value detection circuit 7-4 outputs the amplitude values while separating them into a positive value (S8) and a negative value (−S8), depending on determination results by the code determining circuit 32 and therefore includes a switch.

A first averaging circuit 33 averages the positive-side amplitude value S8. A second averaging circuit 34 averages the negative-side amplitude value −S8. The two averaging circuits 33, 34 have the same construction as that illustrated in FIG. 9.

A dividing circuit 35 calculates a ratio of an output of each of the averaging circuits 33, 34 to an ideal amplitude value Vd. More specifically, the dividing circuit 35 performs calculations such as Vd/−S8 and Vd/S8 by dividing the ideal amplitude value Vd by the outputs of the averaging circuits 33, 34.

A register 36 holds the above ratio calculated during the training period. A selector 37 selects a positive-side ratio or a negative-side ratio from an output of the determination made by the code determining circuit 32. A multiplying circuit 38 multiplies an output of the equalizing circuit 3 by an output of the selector 37.

In accordance with this embodiment, the amplitude value detection circuit 7-4 detects the positive/negative amplitude values. Noise components in the respective amplitude values are removed by the individual averaging circuits 33, 34. Further, the dividing circuit 35 calculates the ratio to the ideal amplitude value Vd. This ratio is held by the register 36. Then, the output of the equalizing circuit 3 is multiplied by the above ratio. This multiplier may be conceived as a gain. This gain is switched over depending on the polarities (positive and negative) of the outputs of the equalizing circuit 3. The positive/negative asymmetry can be thereby compensated.

Further, the control signal works to make the register hold the multiplier. This implies, as discussed above, that the control signal causes the register to hold the control quantity during the training period. Then, during the data period of the data signal, the output of the equalizing circuit 3 is compensated based on the thus held control quantity. Accordingly, the input signals including the training signal and the data signal are used.

Figure 19:
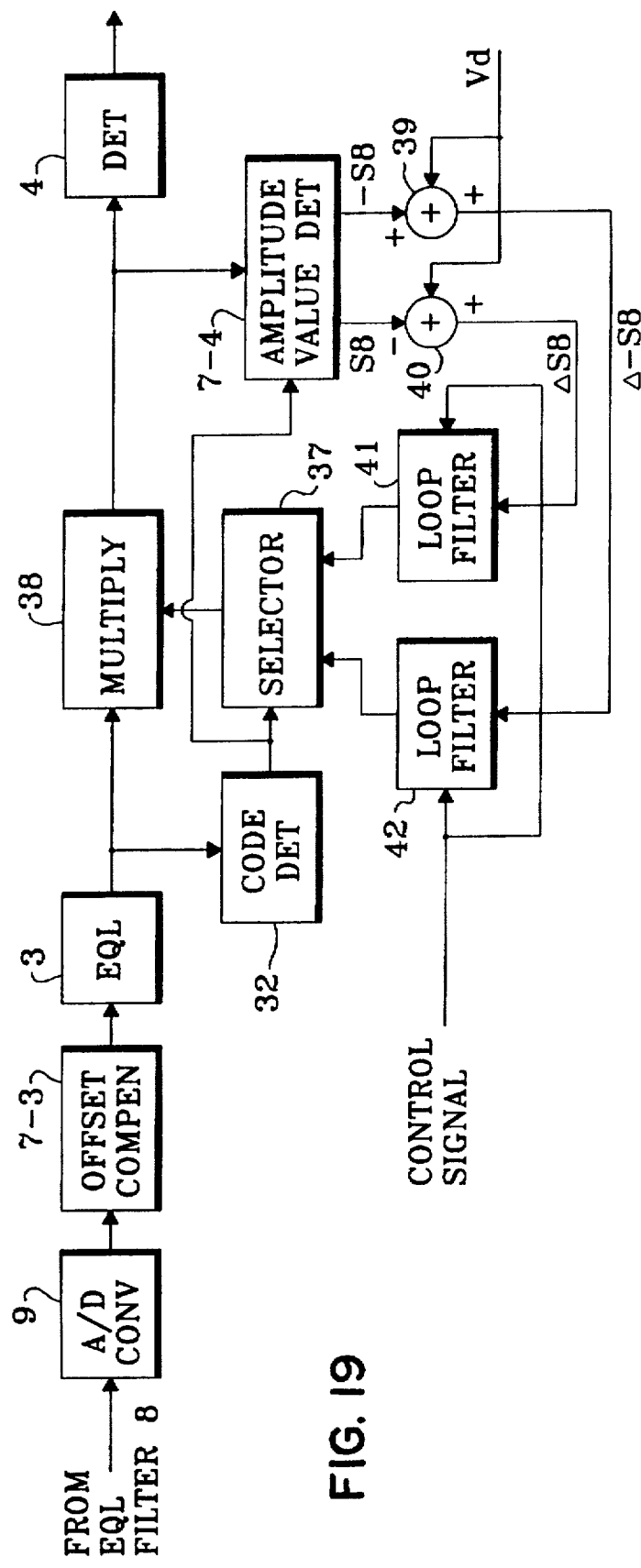
FIG. 19 is a diagram illustrating a construction of a seventh embodiment of the signal regenerating apparatus of the present invention.

FIG. 19 is a block diagram illustrating a seventh embodiment of the signal regenerating apparatus of the present invention. The embodiment of FIG. 18 has dealt with the feed forward compensation, but the embodiment of FIG. 19 will present a feedback example. Referring to FIG. 19, the same components as those shown in FIGS. 9 and 18 are marked with the like symbols.

An adder circuit 39 adds the negative-side amplitude value $-S8$ to the ideal amplitude value Vd. A subtracter circuit 40 subtracts the positive-side amplitude value S8 from the ideal amplitude value Vd. A loop filter 41 removes the noises in the outputs of the adder circuit 39. A loop filter 42 removes the noises of the outputs of the adder circuit 40. The configuration of each of these loop filters 41, 42 is the same as that illustrated in FIG. 10.

In accordance with this embodiment, the amplitude value detection circuit 7-4 detects the positive/negative amplitude values. The adder circuit 39 and the subtracter circuit 40 calculate differences between respective amplitude values and the ideal amplitude value Vd. Noises thereof are removed by the loop filters 41, 42, and the result thereof is held. Then, the output of the equalizing circuit 3 is multiplied by the above difference. This multiplier may be conceived as a gain. This gain is switched over depending on the polarities (positive and negative) of the outputs of the equalizing circuit 3. The positive/negative asymmetry can be thereby compensated.

Further, the control signal works to make each of the registers of the loop filters 41, 42 hold the multiplier. This implies, as discussed above, that the control signal causes the register to hold the control quantity during the training period. Then, during the data period of the data signal, the output of the equalizing circuit 3 is compensated based on the thus held control quantity. Accordingly, the input signals including the training signal and the data signal are used.

Figure 20:
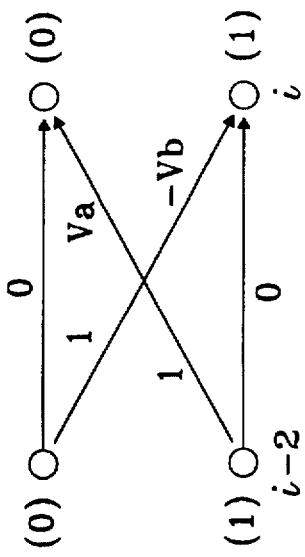
FIG. 20 is an explanatory diagram of a Viterbi detecting operation but showing an eighth embodiment of the present invention.
Figure 21:
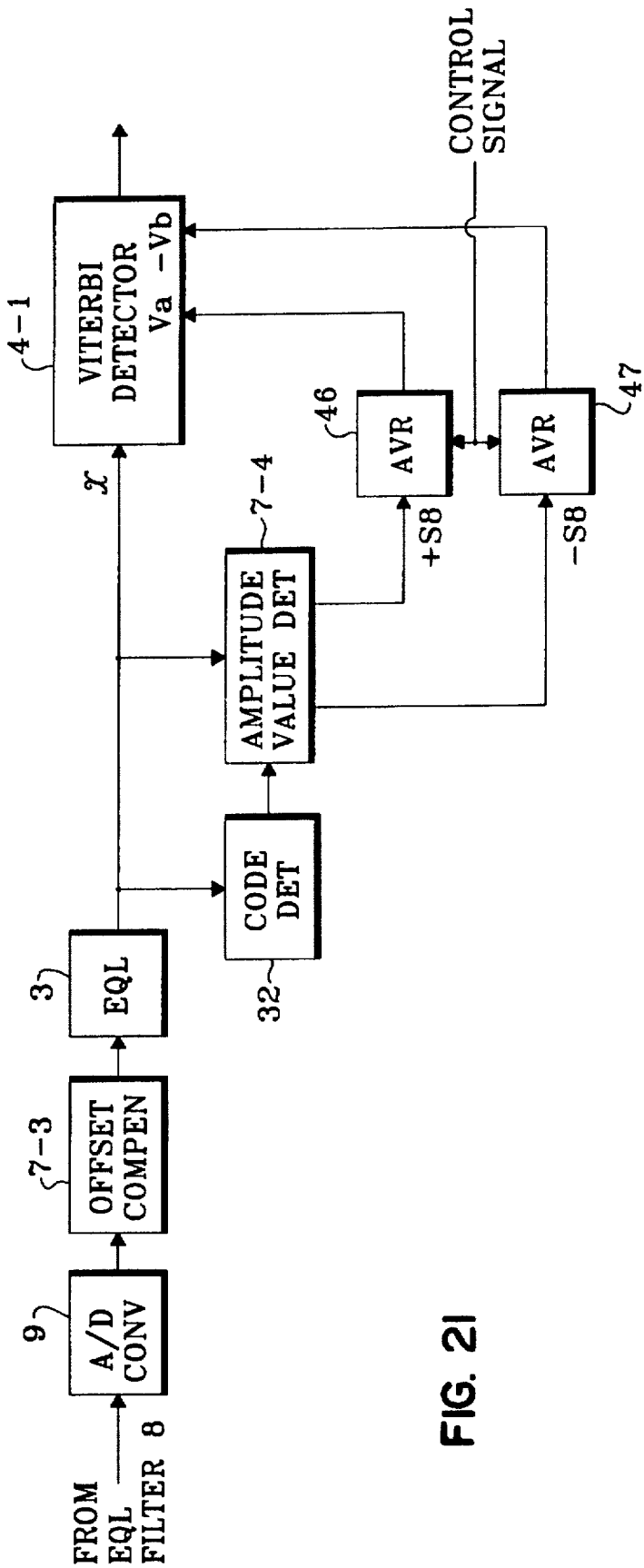
FIG. 21 is a diagram illustrating an eighth embodiment of the signal regenerating apparatus of the present invention.
Figure 22:
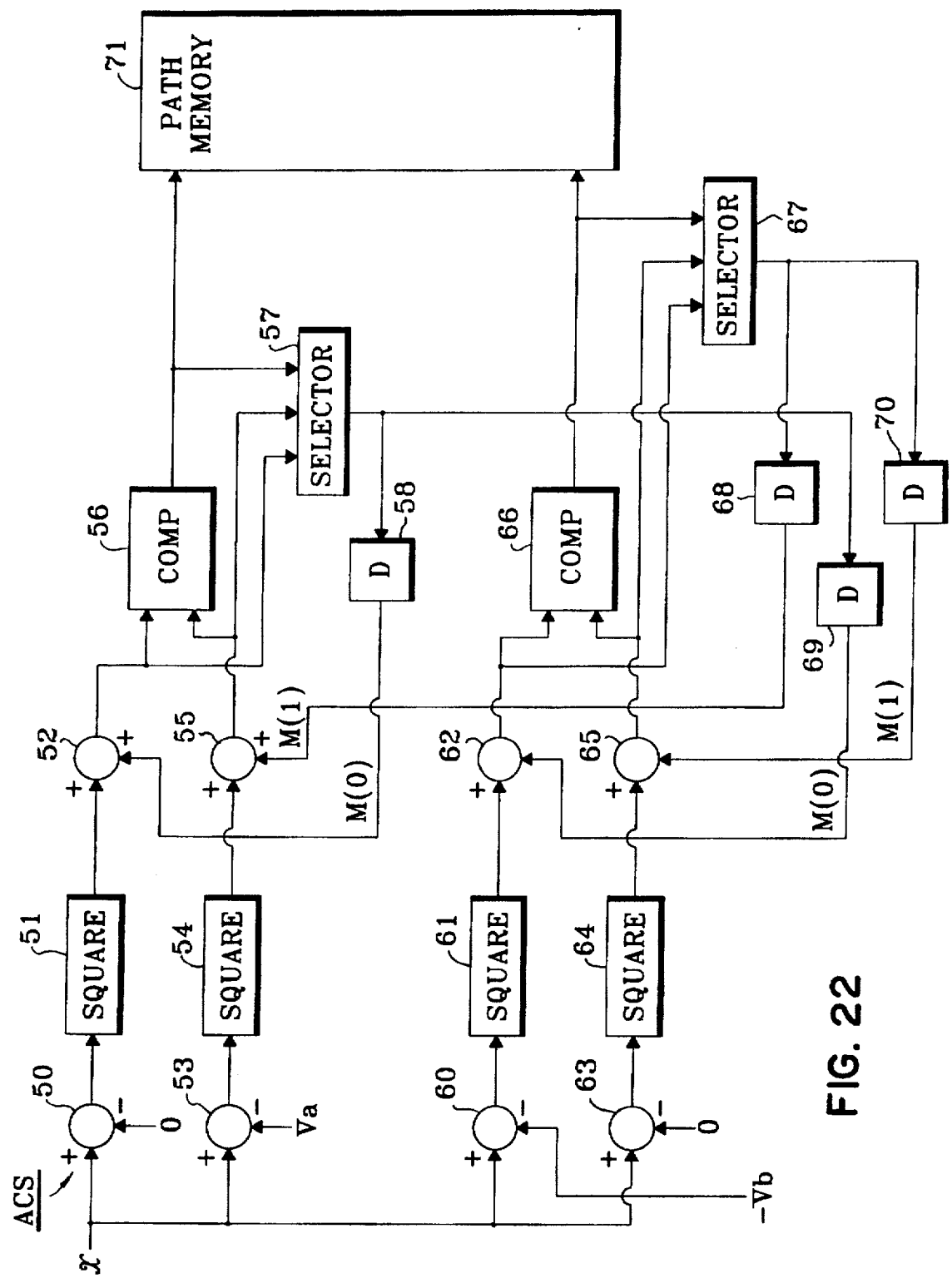
FIG. 22 is a diagram showing a configuration of the Viterbi detector in the construction of FIG. 21.

FIG. 20 is a diagram of assistance in explaining a Viterbi detecting operation. FIG. 21 is a block diagram illustrating an eighth embodiment of the signal regenerating apparatus of the present invention. FIG. 22 is a block diagram showing a Viterbi detector in the construction of FIG. 21.

This embodiment aims at compensating the positive/negative asymmetry by the Viterbi detector. To start with, the Viterbi detecting operation will be described with reference to FIG. 20.

The magnetic disc device in recent years involves the use of a combination of the partial response with a maximum likelihood detecting method (Viterbi detection method). These methods are discussed in the articles such as, e.g., "Optimal Reception for Binary Partial Response Channels", written by M. J. Ferguson, Bell Syst. Tech.J., Vol.51, February 1972 and "Viterbi Detection of Class IV Partial Response on Magnetic Recording Channels", written by R. W. Wood, IEEE Trans. Magn., Vol.Com-34, NO.5, May 1986.

FIG. 20 depicts a part of a trellis diagram in the Viterbi detection method. Shown therein are four possibilities from a state (0) and a state (1) at a timing (i-2) to a state (0) and a state (1) at a timing i. Expected values (hypothetical values) at individual transitions are 0, Va, $-Vb$, 0, respectively.

A metric value M(0); in the state (0) at the timing i is given by the following formula (11):

$$M(0)_i = \text{MIN}\{M(0)_{i-2} + (x-0)^2, \quad (11)$$
$$M(1)_{i-2} + (x-Va)^2\}$$

When transforming this formula, the following formula (12) is obtained.

$$M(0)_i = \text{MIN}\{M(0)_{i-2}, \quad (12)$$
$$M(1)_{i-2} - 2Va \cdot x + Va^2\} + x^2$$

Further, the metric value $M(1)_i$ in the state (1) at the timing i is given by the following formula (13).

$$M(1)_i = \text{MIN}\{M(0)_{i-2} + (x-(-Vb))^2, \quad (13)$$
$$M(1)_{i-2} + (x-0)^2\}$$

When transforming this formula, the following formula (14) is obtained.

$$M(1)_i = \text{MIN}\{M(0)_{i-2} + 2Vb \cdot x + Vb^2, \quad (14)$$
$$M(1)_{i-2}\} + x^2$$

where x is the input to the Viterbi detector. Further, the function MIN may be an algorithm for selecting the smaller of the anterior term and the posterior term in the formula.

In this way, the Viterbi detector, in each transition, obtains a result of adding a square error between the present input signal and the expected value to the past metric value. Executed then is an operation of comparing those results and selecting the smaller of them. Simultaneously, the transition is to be selected.

In the conventional Viterbi detector, the hypothetical values Va, $-Vb$ are determined by only the characteristic of the equalizing circuit. For this reason, the characteristic of the MR head and the signal positive/negative asymmetry are not taken into consideration.

FIG. 21 shows an embodiment in which the expected value of the Viterbi detector counts on the signal asymmetry. Referring to FIG. 21, the same components as those shown in FIG. 18 are marked with the like symbols. A viterbi detector 4-1 takes square errors between an input signal x from the equalizing circuit 3 and the expected values Va, $-Vb$ and selects the transition. the Viterbi detector 4-1 will be mentioned later with reference to FIG. 22.

The code determining circuit 32 determines a code of the output of the equalizing circuit 3. The amplitude value detector 7-4 detects positive/negative amplitude values of the equalizing circuit 3. Furthermore, the amplitude value detector 7-4 outputs the detected amplitude values while separating them into a positive amplitude value +S8 and a negative amplitude value $-S8$, depending on the outputs of the code determining circuit 32.

An averaging circuit 46 averages the positive amplitude value and hold it in accordance with the control signal. An averaging circuit 47 averages the negative amplitude value and holds it in accordance with the control signal. Outputs of these averaging circuits 46, 47 are inputted to the Viterbi detector 4-1 in the form of expected values (hypothetical values) Va, $-Vb$ of the Viterbi detector 4-1.

Thus, the positive/negative amplitude values are detected, and the averaged values thereof are set as hypothetical values. Hence, it is possible to perform the Viterbi detection in accordance with the positive/negative amplitude values of the asymmetrical signal. Accordingly, in the Viterbi detector, the signal positive/negative asymmetry can be compensated.

In this embodiment also, the input signals including the training signal and the data signal are employed. Then, the amplitude value is detected by use of the training signal, and the average value thereof is held. The hypothetical value of the Viterbi detector is set based on this held value. Then, with respect to the data signal, the Viterbi detecting operation is carried out by use of the hypothetical value thereof.

The Viterbi detector 4-1 of FIG. 21 will be explained with reference to FIG. 22.

As illustrated in FIG. 22, the Viterbi detector 4-1 has an ACS (Adder/Compare/Select) circuit ACS and a path memory 71. The path memory 71 holds the selected transition. The ACS circuit ACS calculates the above metric value and selects the transition thereof.

The ACS circuit ACS is constructed of four subtracters 50, 53, 60, 63, four square circuits 51, 54, 61, 64, four adders 52, 55, 62, 65, two comparators 56, 66, two selection circuits 57, 67 and four delay circuits 58, 68, 69, 70.

The subtracter 50 subtracts 0 from the input signal x. Then, the square circuit 51 squares an output of the subtracter 50. Further, the adder 52 adds an output of the square circuit 51 to the previous metric value $M(0)_{i-2}$. Accordingly, an output of the adder 52 turns out an arithmetic result of the left term of the formula (11) given above.

Furthermore, the subtracter 53 subtracts Va from the input signal x. Then, the square circuit 54 squares an output of the subtracter 53. Further, the adder 55 adds an output of the square circuit 54 to the previous metric value $M(1)_{i-2}$. Accordingly, an output of the adder 55 turns out an arithmetic result of the right term of the formula (11) given above.

The comparator 56 compares outputs of the two adders 52, 55 with each other. Then, if the output of the adder 52 is smaller than the output of the adder 55, a transition [0] is outputted. Whereas if the output of the adder 55 is smaller than the output of the adder 52, a transition [1] is outputted. This transition is held by the path memory 71.

The selection circuit 57, when the output of the comparator 56 is [0], selects the output of the adder 52 as a metric value. Reversely, the selection circuit 57, when the output of the comparator 56 is [1], selects the output of the adder 55 as a metric value. This metric value $M(0)_i$ is delayed by the delay circuits 58, 69 and turns out the previous metric value for the next arithmetic.

Similarly, the subtracter 60 subtracts −Vb out of the input signal x. Then, the square circuit 61 squares an output of the subtracter 60. Further, the adder 62 adds an output of the square circuit 61 to the previous metric value $M(0)_{i-2}$. Accordingly, an output of the adder 62 turns out an arithmetic result of the left term of the formula (13) given above.

The subtracter 63 subtracts 0 from the input signal x. Then, the square circuit 64 squares an output of the subtracter 63. Further, the adder 65 adds an output of the square circuit 64 to the previous metric value $M(1)_{i-2}$. Accordingly, an output of the adder 65 turns out an arithmetic result of the right term of the formula (13) given above.

The comparator 66 compares outputs of the two adders 62, 65 with each other. Then, if the output of the adder 62 is smaller than the output of the adder 65, the transition [0] is outputted. Whereas if the output of the adder 65 is smaller than the output of the adder 62, the transition [1] is outputted. This transition is held by the path memory 71.

The selection circuit 67, when the output of the comparator 66 is [0], selects the output of the adder 62 as a metric value. Reversely, the selection circuit 67, when the output of the comparator 66 is [1], selects the output of the adder 65 as a metric value. This metric value $M(1)_i$ is delayed by the delay circuits 68, 70 and turns out the previous metric value for the next arithmetic.

Figure 23:
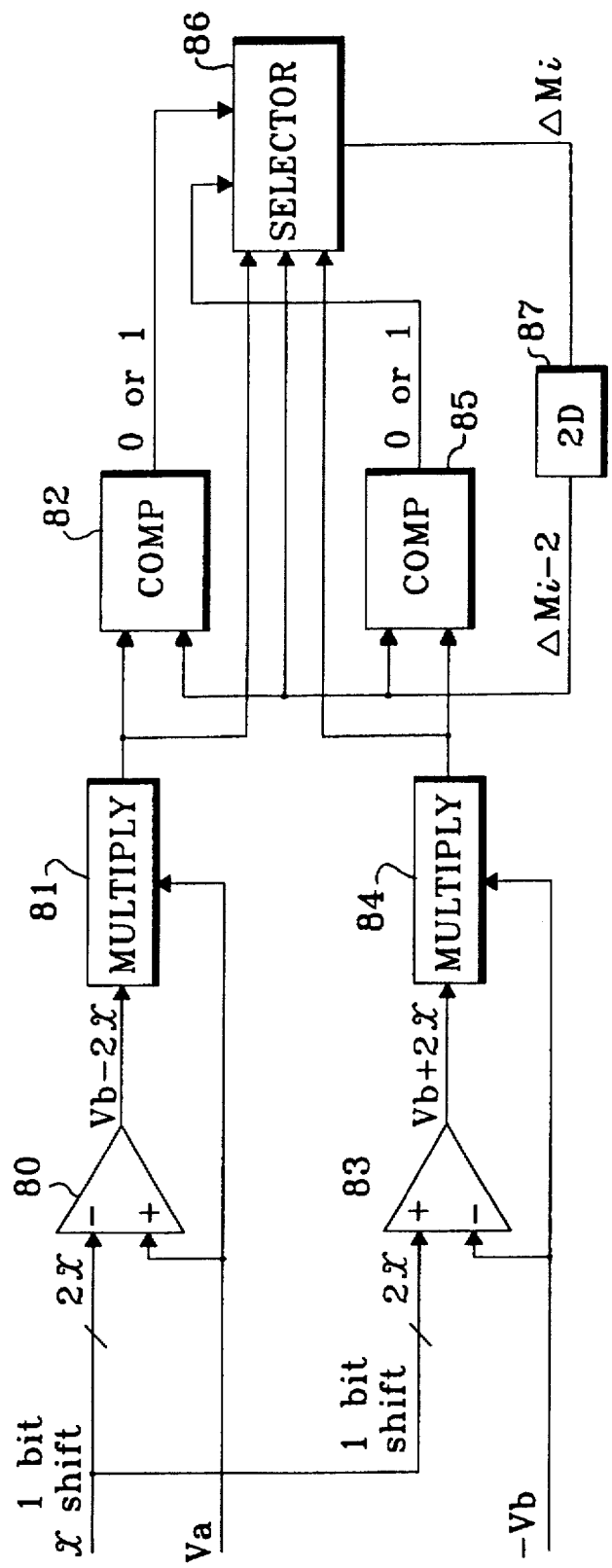
FIG. 23 is a diagram showing another example of a configuration of an ACS circuit in the construction of FIG. 22.

FIG. 23 is a block diagram showing another example of the ACS circuit in FIG. 22.

A difference between the metric values is defined by the following formula (15):

$$\Delta M_i = M(0)_i - M(1)_i \tag{15}$$

When substituting the above formulae (12) and (14) into this formula (15), the formula (16) is acquired.

$$\Delta M_i = \mathrm{MIN}\{M(0)_{i-2}, M(1)_{i-2} - 2Va \cdot x + Va^2\} - \tag{16}$$
$$\mathrm{MIN}\{M(0)_{i-2} + 2Vb \cdot x + Vb^2, M(1)_{i-2}\}$$

From the formula (12), the condition that the transition from the state (0) to the state (0) is given by:

$$M(0)_{i-2} \leq M(1)_{i-2} - 2Va \cdot x + Va^2$$

Hence, when rearranging this, the following formula (17) is obtained:

$$M(0)_{i-2} - M(1)_{i-2} \leq -2Va \cdot x + Va^2 \tag{17}$$

Similarly, from the formula (12), the condition that the transition from the state (1) to the state (0) is selected is given by the following formula (18):

$$M(0)_{i-2} - M(1)_{i-2} > -2Va \cdot x + Va^2 \tag{18}$$

Further, from the formula (14), the condition that the transition from the state (0) to the state (0) is given by:

$$M(0)_{i-2} + 2Vb \cdot x + Vb^2 < M(1)_{i-2}$$

Hence, when rearranging this, the following formula (19) is obtained:

$$M(0)_{i-2} - M(1)_{i-2} < -2Vb \cdot x + Vb^2 \tag{19}$$

Similarly, from the formula (14), the condition that the transition from the state (1) to the state (1) is selected is given by the following formula (20):

$$M(0)_{i-2} - M(1)_{i-2} > -2Vb \times x - Vb^2 \tag{20}$$

Herein, paying attention to the input value x, the formula (18) of the transition from the state (1) to the state (0) is transformed into the formula (21):

$$-(\Delta M_{i-2}/2Va) + (Va/2) < x \tag{21}$$

Similarly, the formula (19) of the transition from the state (0) to the state (1) is transformed into the formula (22):

$$-(\Delta M_{i-2}/2Vb) - (Vb/2) > x \tag{22}$$

Herein, for limiting a magnitude relationship in the left sides between the formulae (21) and (22), it is assumed that the following formulae (23) and (24) are established.

$$\Delta M_{i-2}(Va - Vb) + Va \cdot Vb(Va + Vb) \geq 0 \tag{23}$$

$$(\Delta M_{i-2}/Vb) + Vb \geq (\Delta M_{i-2}/Va) - Va \tag{24}$$

Assuming the above, the conditions for the transitions from the state (0) to the state (0) and from the state (1) to the state (1) are given by trans forming the formulae (17) and (20) into the following formula (25):

$$(-\Delta M_{i-2}/2Vb) - Vb/2 \leq x \leq (-\Delta M_{i-2}/2Va) + Va/2 \tag{25}$$

Summarizing the above, if the following formula (26) is established, there comes the transition from the state (1) to the state (0), and the metric value is updated by the formula (27) which follows:

$$Va(Va - 2x) < \Delta M_{i-2} \quad (26)$$

$$\begin{aligned}\Delta Mi &= M(1)_{i-2} - 2Va \cdot x + Va^2 - M(1)_{i-2} \quad (27)\\ &= Va^2 - 2Va \cdot x\\ &= Va(va - 2x)\end{aligned}$$

Similarly, when the following formula (28) is established, there is a transition from the state (0) to the state (1). Then, the metric value is updated as in the following formula (29):

$$-Vb(Vb + 2x) > \Delta M_{i-2} \quad (28)$$

$$\begin{aligned}\Delta Mi &= M(0)_{i-2} - M(0)_{i-2} - 2Vb \cdot x - Vb^2 \quad (29)\\ &= -Vb^2 - 2Vb \cdot x\\ &= -Vb(Vb + 2x)\end{aligned}$$

Further, if the formulae (26) and (28) are not established, the following formula (30) is established, and there come a transition from the state (0) to the state (0) or from the state (1) to the state (1). Then, the metric value becomes, as indicated in the following formula (31), the past value.

$$Va(Va-2x) \geq \Delta M_{i-2} \geq -Vb(Vb+2x) \quad (30)$$

$$\Delta M_i = M(0)_{i-2} - M(1)_{i-2} = \Delta M_{i-2} \quad (31)$$

FIG. 23 shows an embodiment wherein those formulae are actualized on the circuit.

That is, a subtracter 80 subtracts the input value x (=2x) shifted by one bit out of the hypothetical value Va. A multiplying unit 81 multiplies an output of the subtracter 80 by the hypothetical value Va. A left term of the formula (26) is thereby obtained. A comparator 82 compares a difference $\Delta M_{i-2}$ of the metric value conceived as an output of a delay circuit 84 with an output of the multiplying unit 81.

With this processing, when the formula (26) is established, the transition turns out the one from the state (1) to the state (0), and the transition [1] is outputted from the comparator 82. In a reverse case, the formula (30) is established, and hence, the transition [0] is outputted from the comparator 82.

Similarly, the subtracter 83 subtracts the hypothetical value Vb from the input value x (=2x) shifted by one bit. The multiplying unit 84 multiplies the output of the subtracter 83 by the hypothetical value −Vb. The left term of the formula (28) is thereby obtained. The comparator 85 compares a difference $\Delta_{Mi-2}$ in the metric value conceived as an output of the delay circuit 87 with an output of the multiplying unit 84.

This process leads to an establishment of the formula (28), and there comes the transition from the state (0) to the state (1), and the transition [1] is outputted from the compactor 85. A reverse case conduces to an establishment of the formula (30), and, therefore, the transition [0] is outputted from the comparator 85.

Then, a selector 86 selects the outputs of the multiplying units 81, 84 from the outputs of the two comparators 82, 85, thereby obtaining the metric value $\Delta M_i$.

If done in this manner, as compared with the example of FIG. 22, the two multiplying circuits may suffice. Hence, a simpler configuration can be actualized.

The embodiments discussed above have dealt with the magnetic recording apparatus, but the present invention is applicable to asymmetrical signals in the field of communications.

The present invention, though discussed above by way of the embodiments, can be modified in a variety of forms within the scope of the gist of the present invention, and those modifications are not excluded from the scope of the present invention.

As discussed above, according to the present invention, the offset quantity of the MR head is detected from within the training pattern and subtracted out of the amplitude value of the data pattern. It is therefore possible to reduce the data detection error due to the waveform asymmetry peculiar to the MR head. Further, the whole is constructed of the logic circuits, and this is suitable for a transformation into LSI.

What is claimed is:

1. A signal regeneration apparatus for regenerating an input signal having a training signal and a data signal, comprising:

an asymmetrical signal detection circuit for detecting an offset quantity of the input signal from the training signal;

an averaging circuit for averaging said detected offset quantity;

a subtracting circuit for subtracting the averaged offset quantity from the data signal;

an equalizing circuit for equalizing an output signal of said subtracting circuit; and a data detection circuit for detecting data from an output of said equalizing circuit;

wherein said asymmetrical signal detection circuit includes:

first means for delaying the input signal;

second means for subtracting an output of said first means from the input signal; and third means for subtracting a peak output signal of said second means from a peak signal of the input signal.

2. The signal regenerating apparatus according to claim 1, further comprising:

a multiplying circuit for multiplying a quantity corresponding to the number of data [1] of said data detection circuit by an offset quantity of said asymmetrical signal detection circuit and outputting the multiplied result to said subtracting circuit.

3. The signal regenerating apparatus according to claim 1, wherein the input signal is encoded in an RLL code, and the training signal is set so that a rate of the data [1] in the training signals is equal to a statistic appearance probability of the data [1] of the RLL codes.

4. The signal regenerating apparatus according to claim 3, wherein the RLL code of the training signal is composed of a 8/9 (0, 4, 4) code, and the training signal is set so that the rate of the data [1] of the training signals is 0.6.

5. The signal regenerating apparatus according to claim 3, wherein the RLL code of the training signal is composed of a 8/9 (0, 4, 4) code, the input signal is pre-coded by 1/(1+D), and the training signal is set so that the rate of the data [1] of the training signals is 0.5.

6. The signal regenerating apparatus according to claim 1, further comprising:
   a head for reading the signal from a record medium to obtain the input signal.

7. The signal regeneration apparatus according to claim 1, wherein said third means includes:
   fourth means for delaying an output of said first means;
   fifth means for adding an output of said fourth means and said second means;
   sixth means for generating a gate signal by comparing an output of said fifth means with a predetermined threshold value;
   seventh means for subtracting an output of said second means from the input signal; and
   eighth means for selecting an output of said seventh means in accordance with the gate signal.

* * * * *